(12) United States Patent
Arakawa

(10) Patent No.: US 7,164,604 B2
(45) Date of Patent: Jan. 16, 2007

(54) NONVOLATILE SEMICONDUCTOR MEMORY

(75) Inventor: Ken Arakawa, Kusatsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/245,336

(22) Filed: Oct. 7, 2005

(65) Prior Publication Data
US 2006/0083070 A1   Apr. 20, 2006

(30) Foreign Application Priority Data
Oct. 15, 2004  (JP) ............... P.2004-301766

(51) Int. Cl.
*G11C 16/06*  (2006.01)

(52) U.S. Cl. .............. 365/185.21; 365/185.2; 365/185.23

(58) Field of Classification Search ........... 365/185.21, 365/185.2, 185.23, 185.25, 185.18, 189.07, 365/210
See application file for complete search history.

(56) References Cited

U.S. PATENT DOCUMENTS

| | | | |
|---|---|---|---|
| 5,659,503 A | 8/1997 | Sudo et al. | |
| 5,781,489 A | 7/1998 | Okamoto | |
| 5,936,888 A | 8/1999 | Sugawara | |
| 6,021,068 A * | 2/2000 | Miki et al. | 365/185.21 |
| 6,301,156 B1 * | 10/2001 | Kurosaki | 365/185.2 |
| 6,407,946 B1 | 6/2002 | Maruyama et al. | |
| 6,411,549 B1 * | 6/2002 | Pathak et al. | 365/185.2 |
| 6,707,715 B1 * | 3/2004 | Michael et al. | 365/185.18 |

FOREIGN PATENT DOCUMENTS

JP   10-228790   8/1998

* cited by examiner

*Primary Examiner*—Gene N. Auduong
(74) *Attorney, Agent, or Firm*—McDermott Will & Emery LLP

(57) ABSTRACT

A nonvolatile semiconductor memory includes a memory cell 6 composed of a memory cell transistor 1 having a floating gate and a control gate and a memory cell selecting transistor 2, a reference cell 12 composed of a reference cell transistor 30 having the same structure as the memory cell transistor 1 and a reference cell selecting transistor 8, and a reference word line potential generating circuit 31 connected to a gate of the reference cell selecting transistor 8, wherein, in a reading operation, the same power supply voltage is applied between a floating gate and a source node of the reference cell transistor 30, and an intermediate potential between a potential applied when the memory cell selecting transistor 2 is selected and a potential applied when the memory cell selecting transistor 2 is not selected is applied to the gate of the reference cell selecting transistor 8.

26 Claims, 18 Drawing Sheets

NONVOLATILE SEMICONDUCTOR MEMORY

BACKGRUOD OF THE INVENTION

1. Field of the Invention

The present invention relates to a nonvolatile semiconductor memory capable of reading stably data at a high speed by using a differential sense amplifier that compares/decides a memory cell current and a reference cell current.

2. Description of the Related Art

In the nonvolatile semiconductor memory such as the flash type, EEPROM, or the like, a charge injection into a floating gate of the memory cell transistor and a charge extraction from there is executed by a writing operation, then a difference in a quantity of charge held in the floating gate is sensed as a memory cell current, and then this current is read as data.

In the flash type nonvolatile semiconductor memory, in order to realize a stable reading operation by maintaining a constant amount of memory cell current over a wide power supply voltage range in the time of reading, a measure is taken to set control gate potential applied to the memory cell transistor in such a manner that such potential does not to have a power supply voltage dependency.

Since the control gate potential is set not to have the power supply voltage dependency, like the memory cell transistor, by using a transistor having the completely same structure as the memory cell transistor as a reference cell transistor, a constant amount of reference cell current is maintained over the wide power supply voltage range. Then, a difference between the memory cell current and the reference cell current is amplified by a differential sense amplifier, and thus the data can be read at a high speed over the wide power supply voltage range with good precision.

Also, in the case of the EEPROM in which the selecting transistor and the N-channel memory cell transistor constitute one memory cell, the reading characteristic can also be realized over the wide power supply voltage range like the flash type if the data can be read by applying a ground potential to control gates of the memory cell transistor and the reference cell transistor.

In this manner, according to the reading system using the transistor having the completely same structure as the memory cell transistor as the reference cell transistor, the unstable factors due to the variation in the power supply voltage characteristic, the temperature characteristic or the production parameters, and the like can be suppressed, nevertheless a threshold value of the reference cell transistor must be set to a middle value between respective threshold values of two data of the memory cell transistor. Therefore, a quantity of charge in the floating gate of the reference cell transistor must be controlled by the rewriting process.

FIG. 17 is a block diagram showing an overall configuration of an EEPROM type nonvolatile semiconductor device in the prior art in case the memory cell is the N-channel MOS transistor.

In FIG. 17, 1 is a memory cell transistor, 2 a memory cell selecting transistor, 3 a bit line, 4 a word line, 5 a memory cell transistor control gate line, 6 a memory cell array composed of electrically rewritable nonvolatile memory cells that are arranged in intersecting positions between a plurality of word lines and a plurality of bit lines in a matrix fashion, 7 a reference cell transistor, 8 a reference cell selecting transistor, 9 a reference bit line, 10 a reference word line, 11 a reference cell transistor control gate line, and 12 a reference cell array composed of reference cells that are arranged in intersecting positions between a plurality of reference word lines and a plurality of reference bit lines.

Also, 13 is a column gate used to select one bit line from a plurality of bit lines of the memory cell array 6, 14 a column gate selecting line, 15 a column decoder composed of a plurality of column gates, 16 a reference column gate used to select one reference bit line from a plurality of reference bit lines of the reference cell array 12, 17 a reference column gate selecting line, and 18 a reference column decoder composed of a plurality of reference column gates.

In addition, 19 is a bit line potential control circuit used to control a potential of the bit line 3 in the reading operation, 20 a reference bit line potential control circuit used to control a potential of the reference bit line 9 in the reading operation, 21 a bit line potential control transistor used to control a potential of the bit line 3 selected in the reading operation by the bit line potential control circuit 19, 22 a reference bit line potential control transistor used to control a potential of the reference bit line 9 selected in the reading operation by the reference bit line potential control circuit 20, 23 a bit line load element used to charge the bit line via the bit line potential control transistor 21 in the reading operation, 24 a reference bit line load element used to charge the reference bit line via the reference bit line potential control transistor 22 in the reading operation, 25 a sense amplifier input node on the bit-line side, 26 a sense amplifier input node on the reference bit-line side, and 27 a sense amplifier.

In the above configuration, the reference cell transistor 7 is rewritable and has the same configuration as the memory cell transistor 1. Prior to the product delivery, the charges are set to the floating gate by the rewriting process such that a threshold value of the reference cell transistor 7 must be set to a middle value between respective threshold values of two data "ON" and "OFF" of the memory cell transistor 1.

Also, the memory cell selecting transistor 2 has such a structure that the control gate and the floating gate are short-circuited or a leading node that can control electrically the floating gate itself is provided. The word line 4 is connected electrically to the floating node of the memory cell selecting transistor 2. In addition, the reference cell selecting transistor 8 has the same structure as the memory cell selecting transistor 2.

Then, an operation of the nonvolatile semiconductor memory constructed as above in the prior art will be explained hereunder. First, in the reading operation, a ground potential that is equal to a source node is applied to both all memory cell transistor control gate lines 5 of the memory cell array 6 and all reference cell transistor control gate lines 11 of the reference cell array 12.

The word line 4 and the reference word line 10 selected based on the external address are shifted to the power supply voltage from the ground potential. Also, the column gate selecting line 14 for selecting the bit line 3 and the reference column gate selecting line 17 for selecting the reference bit line 9 are shifted to the power supply voltage from the ground potential.

Then, the bit line potential control circuit 19 and the reference bit line potential control circuit 20 control gates of the bit line potential control transistor 21 and the reference bit line potential control transistor 22 respectively. Thus, the bit line 3 and the reference bit line 9 are charged up to a predetermined potential by the bit line load element 23 and the reference bit line load element 24 respectively.

Accordingly, a memory cell current flows from the bit line load element 23 to the source node of the memory cell transistor 1 in response to a threshold value of the memory cell transistor 1. Also, a reference cell current flows from the reference bit line load element 24 to the source node of the reference cell transistor 7 in response to a threshold value of the reference cell transistor 7.

At this time, a difference of the current flow between the memory cell current and the reference cell current appears as a potential difference between the sense amplifier input node 25 on the bit-line side and the sense amplifier input node 26 on the reference bit-line side, and then differentially amplified by the sense amplifier 27 and output as the data.

FIG. 18 is a power supply voltage characteristic view of the memory cell current and the reference cell current in the operation of the nonvolatile semiconductor memory. In FIG. 18, 40 is an "ON" memory cell current, 41 is an "OFF" memory cell current, and 42 is the reference cell current. The reference cell current 42 of the reference cell transistor 7 is set to a middle value between the "ON" memory cell current 40 and the "OFF" memory cell current 41 by the rewriting operation.

Since a quantity of charge held in the floating node does not have the power supply voltage dependency, there is no power supply voltage dependency in the potential between the source gates of the memory cell transistor 1 and the reference cell transistor 7. Therefore, the power supply voltage dependencies of the memory cell currents 40, 41 and the reference cell current 42 depend on the power supply voltage dependencies of the memory cell selecting transistor 2 and the reference cell selecting transistor 8.

Since the reference cell selecting transistor 8 has the same structure as the memory cell selecting transistor 2, the power supply voltage dependency has the same characteristic. In FIG. 18, the difference between the current values required for the reading can be obtained over the wide power supply voltage range from VDDL on the low voltage side to VDDH on the high voltage side.

In the nonvolatile semiconductor memory, as the read circuit technology to suppress the unstable factors due to the variation in the power supply voltage characteristic or the temperature characteristic of the memory cell, or the production parameters, and the like, the method of employing such a structure that the control gate and the floating gate of the reference cell transistor are short-circuited or the leading node that can control electrically the floating gate itself of the reference cell transistor is provided, and then controlling a potential of the floating gate of the reference cell transistor by the bias circuit to set the-reference cell current to a predetermined current has been proposed, in addition to the above prior art (see JP-A-10-228790, for example).

However, according to the reading system using the transistor having the structure completely identical to the memory cell transistor as the reference cell transistor, such problems existed that, because a write level of the reference cell transistor must be set prior to the product delivery, a production cost is increased and that, because the reference cell current is varied when a quantity of charge in the floating gate of the reference cell transistor is varied due to the external stress, the temperature stress, or the like in the reading operation, a reading margin is deteriorated.

Alternately, according to the method of employing the structure having the leading node, which can control electrically the floating gate itself, as the reference cell and then controlling a potential of the floating gate by the potential generating circuit, such a problem existed that a consumption current is increased to cause the potential generating circuit to operate continuously. Also, in case the potential generating circuit is caused to operate intermittently, such a problem existed that charge/discharge currents of the reference cell control line accompanied with the intermittent operation is increased.

SUMMARY OF THE INVENTION

It is an object of the present invention to provide a nonvolatile semiconductor device capable of suppressing unstable factors caused due to variation in the power supply characteristic of the circuit or the temperature characteristic of the memory cell or production parameters, and the like to thus achieve reduction of a production cost increasing factor, a deteriorating factor after the delivery, and the like, and also capable of suppressing an increase of a consumption current to the lowest minimum.

A nonvolatile semiconductor memory of the present invention, includes a memory cell composed of a memory cell transistor having a floating gate and a control gate and a memory cell selecting transistor; a reference cell composed of a reference cell transistor, which has a same structure as the memory cell transistor and to a floating gate of which a predetermined potential is applied, and a reference cell selecting transistor; a differential sense amplifier for comparing/deciding a current of the selected bit line and a current of the reference bit line in a reading operation; and a reference word line potential generating circuit connected to a floating gate of the reference cell selecting transistor to generating a reference word line potential; wherein the reference word line potential is controlled to a first potential between a potential applied to the selected word line and a potential applied to the unselected word line.

At this time, a connection sequence of the memory cell transistor and the memory cell selecting transistor to the source power supply line or a connection sequence of the reference cell transistor and the reference cell selecting transistor to the source power supply line may be reversed Also, the memory cell transistor and the memory cell selecting transistor may be formed of either of the N-channel transistor and the P-channel transistor.

Also, it is desirable that gate oxide films of the memory cell transistor and the reference cell transistor should have the same film thickness dimension and gate oxide films of the memory cell selecting transistor and the reference cell selecting transistor should have the same film thickness dimension.

Also, in the nonvolatile semiconductor memory of the present invention, a reference cell selecting signal to select a gate of the reference cell selecting transistor is input into the reference word line potential generating circuit, and the reference word line potential generating circuit generates the first potential when a reading operation is executed and the reference cell selecting signal is activated, and an amplitude of a potential applied to the reference word line is controlled to range from an unselected potential to the first potential.

According to the above configuration, since the power supply voltage characteristic of the potential applied to the floating gate of the reference cell selecting transistor can be controlled, the power supply voltage characteristic of the reference cell current can be controlled to come close to the power supply voltage characteristic of the memory cell current. Therefore, the power supply voltage dependency of the reading speed can be relaxed or the unstable factors caused due to variation in the temperature characteristic of the memory cell or production parameters, etc. can be suppressed and in addition a production cost increasing factor, a deteriorating factor after the delivery, and the like can be reduced.

In addition, the amplitude of the reference word line can be made small. Therefore, the consumption current in the charging/discharging operations can be reduced, and an increase of the consumption current in the reference word line potential generating circuit can be suppressed to the lowest minimum.

Also, in the nonvolatile semiconductor memory of the present invention, the reference word line potential generating circuit is composed of a plurality of potential generating means for generating the first potential, and the plurality of potential generating means are controlled to be sequentially unactivated after an amplitude of a potential applied to the reference word line is controlled to rise from an unselected potential to the first potential.

According to this configuration, since the amplitude of the reference word line is made small, the consumption current in the charging/discharging operations can be reduced and at the same time the current supply capability of the potential generating means is controlled to start at its maximum. Therefore, the charging/discharging operations of the reference word line can be executed in a short time, and thus an increase of the consumption current can be suppressed to the lowest minimum while preventing the deterioration of the reading time.

Also, in the nonvolatile semiconductor memory of the present invention, the reference word line potential generating circuit is composed of a plurality of potential generating means for generating the first potential, only the potential generating means having a minimum current supply capability is activated when a reading operation is executed and the reference cell selecting signal is not activated, the reference word line potential generating circuit generates the first potential when the reference cell selecting signal is activated, and an amplitude of a potential applied to the reference word line is controlled to range from an unselected potential to the first potential.

According to this configuration, a rise time required for the reference word line potential generating circuit to generate the potential when the reference cell selecting signal is activated during the reading operation can be minimized, and thus the reference word line can be selected at a high speed. Therefore, the reading operation can be carried out at a high speed.

Also, in the nonvolatile semiconductor memory of the present invention, the reference word line potential generating circuit is composed of a plurality of potential generating means for generating the first potential, a plurality of reading mode signals to discriminate a plurality of reading operation modes are input into a plurality of reading mode signals to discriminate a plurality of reading operation modes, and the plurality of potential generating means are switched in response to the plurality of reading mode signals and activated in the reading operation.

According to this configuration, in case a plurality of reading operation modes each having a different reading operating frequency are provided, a plurality of potential generating means each having the different consumption current can be used separately in answer to the current supply capability needed for each operating frequency. Therefore, the consumption current can be suppressed to the optimum value every reading operation mode.

Also, in the nonvolatile semiconductor memory of the present invention, the reference word line potential generating circuit is composed of a plurality of potential generating means for generating a plurality of potentials, a plurality of reading mode signals to discriminate a plurality of reading operation modes are input into the reference word line potential generating circuit, and one potential generating means is selected based on the reading mode signal and activated in the reading operation.

According to this configuration, a plurality of potential generating means can be used separately such that the reference word line potential having the different optimum value every reading power supply voltage range is generated every mode of a plurality of reading operation modes each having the different reading power supply voltage range. Therefore, the power supply voltage characteristic can be adjusted to the optimum value every reading operation mode.

Also, the nonvolatile semiconductor memory of the present invention further includes a voltage applying transistor connected to the floating gate of the reference cell transistor; wherein a first test reading operation mode in which a potential is applied from an external terminal via the voltage applying transistor is provided.

According to this configuration, a threshold value of the reference cell transistor can be set variably while considering the same current characteristic of the reference selecting transistor as that in the reading operation. As a result, if the variable reference cell current and the memory cell current are compared/decided in the test step or after the rewriting process after the delivery, the threshold value of the memory cell transistor can be checked after a variation of the reference cell current is taken into consideration.

Also, the nonvolatile semiconductor memory of the present invention further includes a voltage applying transistor connected to the floating gate of the reference cell transistor; wherein, in a second test reading operation mode, a predetermined potential is applied from the external terminal via the voltage applying transistor, and all word lines are controlled into an unselected state.

According to this configuration, the memory cell current can be suppressed to only a total leakage current from the non-selected memory cells after the same current characteristic of the reference selecting transistor as that in the reading operation is considered. As a result, if the variable reference cell current and the leakage current of the selected bit line are compared/decided in the test step, the bit line leakage current of the unselected memory cell of the selected bit line can be checked after a variation of the reference cell current is considered.

Also, the nonvolatile semiconductor memory of the present invention further includes the reference cell, to which the voltage applying transistor is connected, in plural; wherein at least one of reference cells is connected to the bit line, and a third test reading operation mode in which only the memory cell connected to the bit line and the reference cell connected to the reference bit line are selected and all word lines are controlled into an unselected state is provided.

According to this configuration, respective currents on the selected bit line and the reference bit line are limited to only the reference cell current after the same current characteristic of the reference selecting transistor as that in the reading operation is considered. As a result, if the reference cell currents are compared/decided, the offset of the sense amplifier can be checked after a variation of the reference cell current is considered.

According to the present invention, the power supply voltage characteristic of the reference cell current can be controlled to come close to the power supply voltage characteristic of the memory cell current. Therefore, the power supply voltage dependency of the reading speed can be relaxed or the unstable factors caused due to variation in the temperature characteristic of the memory cell or production parameters, etc. can be suppressed and in addition a production cost increasing factor, a deteriorating factor after the delivery, and the like can be reduced.

Also, according to the present invention, the reference word line potential is generated only when the reference cell selecting signal is activated, and the potential of the reference word line can be made small in amplitude from the unselected potential to the reference word line potential. Therefore, the consumption current in the charging/discharging operations can be reduced, and an increase of the consumption current in the reference word line potential generating circuit can be suppressed to the lowest minimum.

Also, according to the present invention, a plurality of potential generating means for generating the same potential while changing the current supply capability are provided to the reference word line potential generating circuit. Therefore, the charging/discharging operations of the reference word line can be executed in a short time, and thus an increase of the consumption current can be suppressed to the lowest minimum while preventing the deterioration of the reading time.

Also, according to the present invention, a plurality of potential generating means are provided to the reference word line potential generating circuit such that only the potential generating means having the minimum current supply capability is selected and activated when the reading operation is executed and the reference cell selecting signal is not activated. Therefore, the reading operation can be carried out at a high speed.

Also, according to the present invention, a plurality of potential generating means for generating the same potential in the reading operation while changing the current supply capability in response to the reading operation mode are provided the reference word line potential generating circuit. Therefore, the consumption current can be suppressed to the optimum value every mode of a plurality of reading operation modes each having the different reading frequency.

Also, according to the present invention, a plurality of potential generating means having the different generated potential are provided the reference word line potential generating circuit such that a plurality of potential generating means are switched in response to the reading mode signal in the reading operation. Therefore, the power supply voltage characteristic can be set to the optimum value every mode of a plurality of operation modes each having the different power supply voltage range.

Also, according to the present invention, the external voltage applying transistor connected to the floating gate of the reference cell transistor is provided. Therefore, the threshold value of the memory cell transistor can be checked after a variation of the same reference cell current as that in the reading operation is taken into consideration.

Also, according to the present invention, the external voltage applying transistor connected to the floating gate of the reference cell transistor is provided, and all word lines can be controlled to the unselected state. Therefore, the leakage current of the selected memory cell of the selected bit line can be checked after a variation of the same reference cell current as that in the reading operation is considered.

Also, according to the present invention, the external voltage applying transistor connected to the floating gate of the reference cell transistor is provided, and at least one of the reference cells is controlled to be connected to the bit line. Therefore, the offset of the sense amplifier can be checked after a variation of the same reference cell current as that in the reading operation is considered.

BREIF DESCRIPTION OF THE DRAWINGS

DESCRIPTION OF THE PREFERRED EMBODIMENTS (Embodiment 1)

Figure 1:
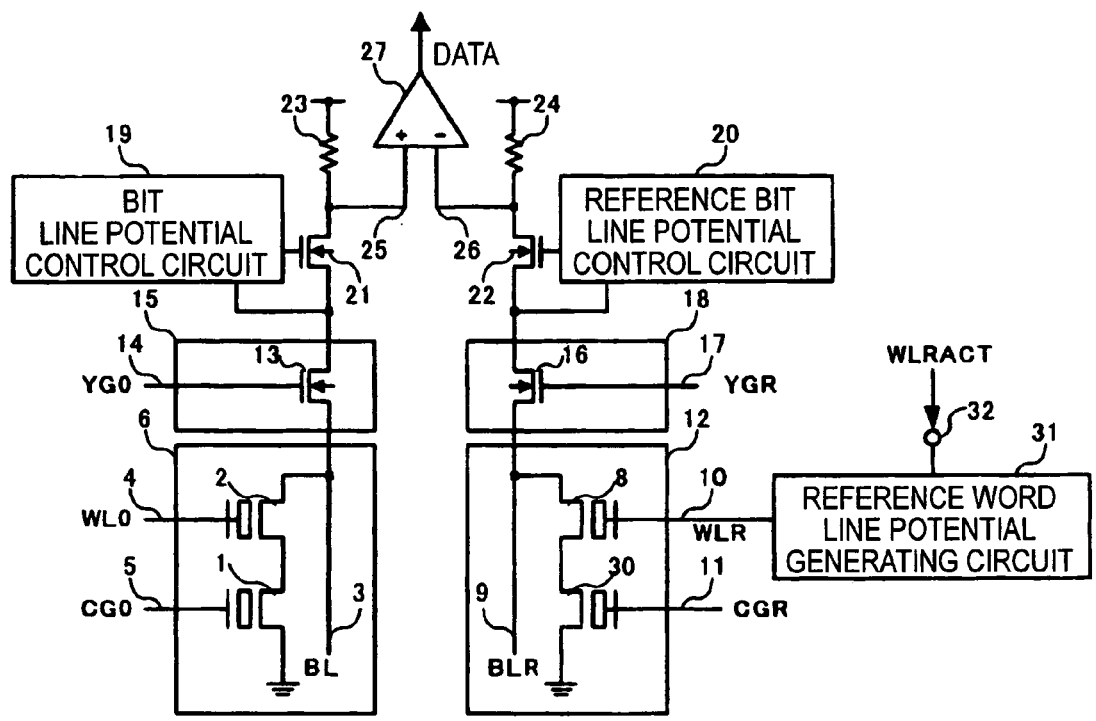
FIG. 1 is a block diagram showing an overall configuration of a nonvolatile semiconductor device according to an embodiment 1 of the present invention.

FIG. 1 is a block diagram showing an overall configuration of a nonvolatile semiconductor device according to an embodiment 1 of the present invention. In FIG. 1, 1 is the memory cell transistor, 2 the memory cell selecting transistor, 3 the bit line, 4 the word line, 5 the memory cell transistor control gate line, 6 the memory cell array composed of nonvolatile memory cells, 8 the reference cell selecting transistor, 9 the reference bit line, 10 the reference word line, 11 the reference cell transistor control gate line, and 12 the reference cell array composed of reference cells.

Figure 17:
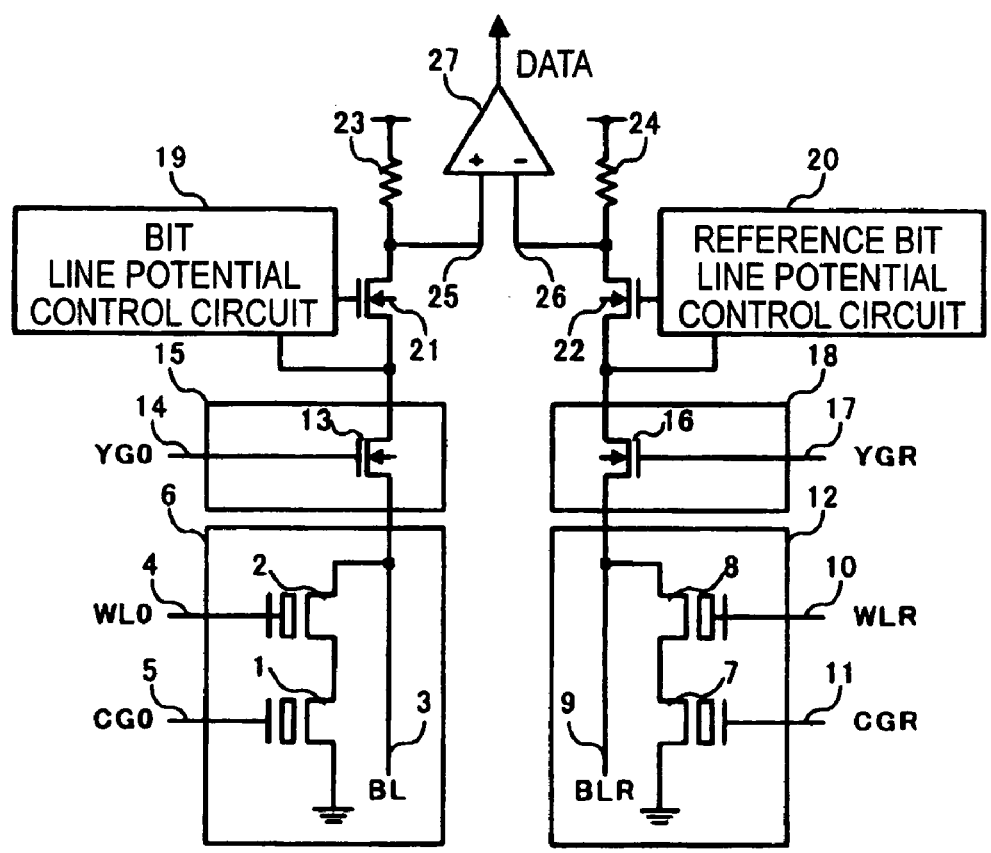
FIG. 17 is a block diagram showing an overall configuration of an EEPROM type nonvolatile semiconductor device in the prior art.
Figure 18:
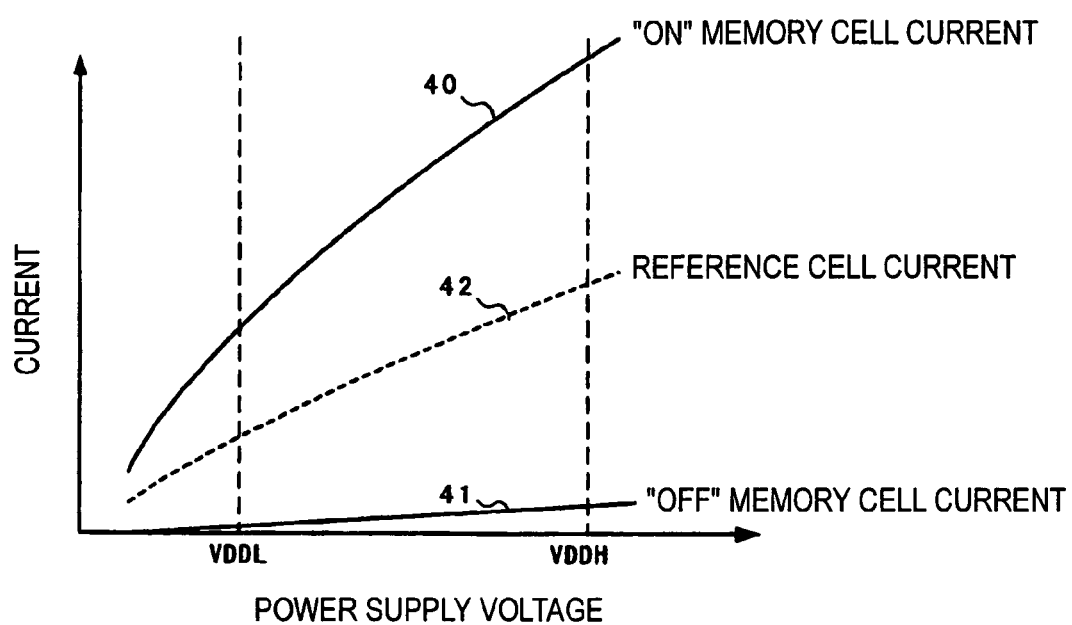
FIG. 18 is a power supply voltage characteristic view of a memory cell current and a reference cell current in the nonvolatile semiconductor device in the prior art.

Also, 13 is the column decoder, 14 the column gate selecting line, 15 the column decoder, 16 the reference column gate, 17 the reference column gate selecting line, 18 the reference column decoder, 19 the bit line potential control circuit, 20 the reference bit line potential control circuit, 21 the bit line potential control transistor, 22 the reference bit line potential control transistor, 23 the bit line load element, 24 the reference bit line load element, 25 the sense amplifier input node on the bit-line side, 26 the sense amplifier input node on the reference bit-line side, and 27 the sense amplifier. Theses are identical to the structure shown in FIG. 17 in the prior art.

In addition, 30 is a reference cell transistor, which has such a structure that the control gate and the floating gate are short-circuited like the memory cell selecting transistor 2 or the leading node that cab control electrically the floating gate itself is provided, unlike the prior art. The floating gate is connected to the reference cell transistor control gate line 11.

Also, 31 is a reference word line potential generating circuit, which is not provided as the constituent element in the prior art. Also, 32 is a reference cell selecting signal WLRACT that is input into the reference word line potential generating circuit 31

In this case, the order of the memory cell transistor and the memory cell selecting transistor connected to the source line may be reversed, and the order of the reference cell transistor and the reference cell selecting transistor connected to the source line may be reversed.

Also, in light of the variation of the temperature characteristic or the production parameters, it is desired that the reference cell selecting transistor 8 should have the same structure as the memory cell selecting transistor 2 and the oxide film should have the same film thickness. Similarly, it is desired that the oxide film of the reference cell transistor 30 should have the same film thickness as the memory cell transistor 1.

Then, an operation of the nonvolatile semiconductor memory constructed as above will be explained hereunder. First, in the reading operation, the same ground potential as the source node is applied to all memory cell transistor control gate lines 5 of the memory cell array 6. In contrast, the power supply voltage is applied to all reference cell transistor control gate lines 11 of the reference cell array 12.

The word line 4 selected according to the external address is shifted to the power supply voltage from the ground potential. Also, a reference word line potential generated by the reference word line potential generating circuit 31 is applied to the reference word line 10 selected by the reference cell selecting signal 32.

Also, the column gate selecting line 14 for selecting the bit line 3 and the reference column gate selecting line 17 for selecting the reference bit line 9 are shifted to the power supply voltage from the ground potential. Then, like the prior art, the bit line potential control circuit 19 and the reference bit line potential control circuit 20 control gates of the bit line potential control transistor 21 and the reference bit line potential control transistor 22 respectively. Thus, the bit line 3 and the reference bit line 9 are charged up to a predetermined potential by the bit line load element 23 and the reference bit line load element 24 respectively.

Accordingly, a memory cell current flows from the bit line load element 23 to the source node of the memory cell transistor 1 in response to a threshold value of the memory cell transistor 1. Also, a reference cell current controlled by a gate potential of the reference cell selecting transistor 8 flows from the reference bit line load element 24 to the source node of the reference cell transistor 30.

At this time, like the prior art, a difference of the current flow between the memory cell current and the reference cell current appears as a potential difference between the sense amplifier input node 25 on the bit-line side and the sense amplifier input node 26 on the reference bit-line side, and then differentially amplified by the sense amplifier 27 and output as the data.

Figure 2:
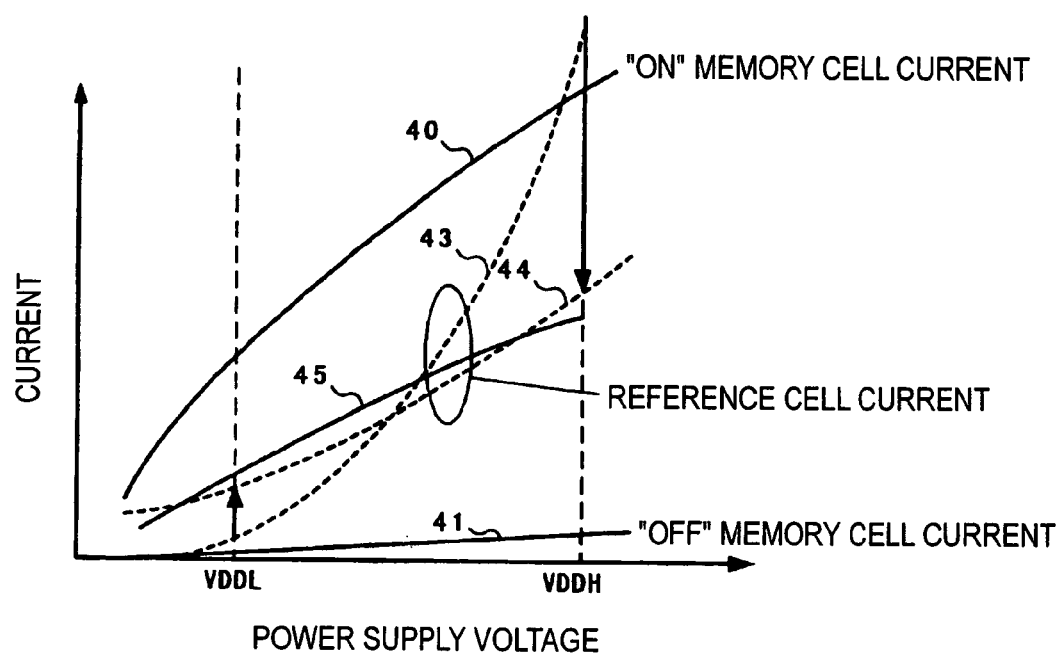
FIG. 2 is a power supply voltage characteristic view of a memory cell current and a reference cell current in the nonvolatile semiconductor device according to the embodiment 1 of the present invention.
Figure 3:
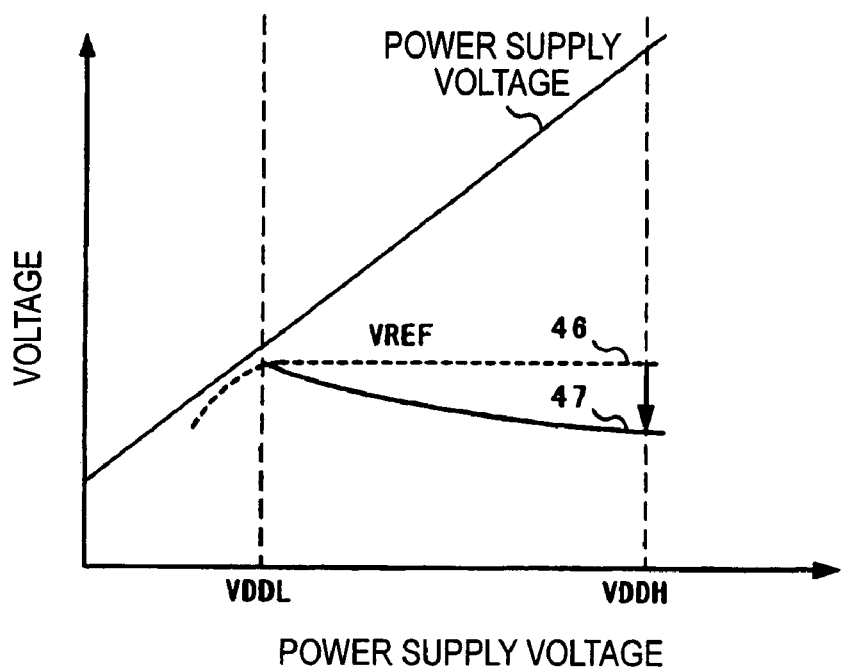
FIG. 3 is a power supply voltage characteristic view of a reference word line potential VREF in the nonvolatile semiconductor device according to the embodiment 1 of the present invention.

FIG. 2 is a power supply voltage characteristic view of the memory cell current and the reference cell current in the nonvolatile semiconductor memory according to the present embodiment. Also, FIG. 3 is a power supply voltage characteristic view of a reference word line potential VREF.

In FIG. 2, 40 is the "ON" memory cell current, 41 is the "OFF" memory cell current, and 43, 44, 45 are a reference cell current respectively. Also, in FIG. 3, 46 is a reference word line potential that is a constant voltage and has no power supply voltage dependency and 47 is a reference word line potential whose power supply voltage dependency is in inverse proportion to the power supply voltage.

When the reference word line potential is equal to the power supply voltage, the reference cell current different from the memory cell current is derived as given by the current 43 and thus the wide power supply voltage range cannot be assured. However, if the reference word line potential is set to a first potential that is a constant voltage in the middle between the ground potential and the power supply voltage, as given by a characteristic line 46 in FIG. 3, the reference cell current of the reference cell transistor 30 is given as 44 in the middle between the "ON" memory cell current 40 and the "OFF" memory cell current 41.

Here, there is no power supply voltage dependency in the source-gate potential of the memory cell transistor 1. In this case, since the source-gate potential of the reference cell transistor 30 has the power supply voltage dependency, the power supply voltage characteristic is different according to such dependency.

In contrast, if the power supply voltage dependency of the reference word line potential is controlled such that, as given by the characteristic line 47 in FIG. 3, the voltage on the higher voltage side becomes lower than that on the lower voltage side, the current characteristic as given by the current 45 in FIG. 2 can be realized, so that the power supply voltage characteristics of the memory cell current and the reference cell current can be put close to the same characteristic. As a result, a difference of the current value required for the reading can be obtained over the wide power supply voltage range from VDDL on the low voltage side to VDDH the high voltage side.

As described above, because the potential like the characteristic 46, preferably the characteristic 47 in FIG. 3 is applied to the reference word line, the power supply voltage dependency of the read speed can be relaxed rather than the case where the power supply voltage is applied to the reference word line as it is.

Figure 4:
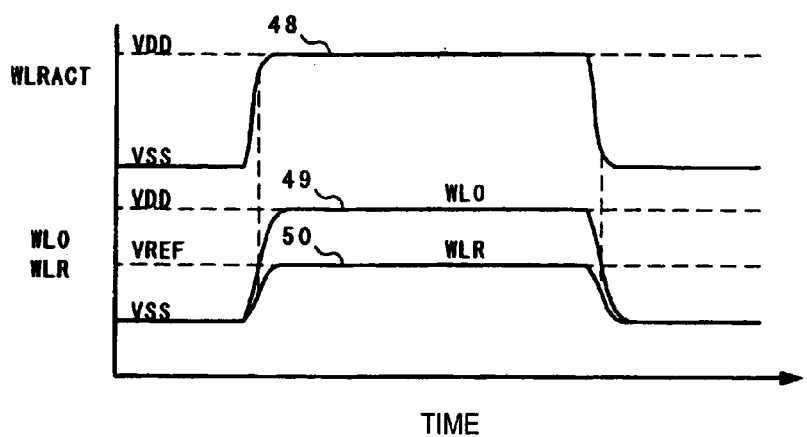
FIG. 4 is a waveform diagram of a word line and a reference word line in the nonvolatile semiconductor device according to the embodiment 1 of the present invention.

Then, an operation of generating the reference word line potential will be explained with reference to FIG. 4 that shows a waveform diagram of the word line and the reference word line. When, WLRACT of the reference cell selecting signal 32 is activated, the reference word line potential VREF generated by the reference word line potential generating circuit 31 is applied to WLR of the selected reference word line 10. Thus, the reference word line is controlled to shift within an amplitude VSS to VREF.

Since the amplitude can be reduced rather than the case where the reference word line is shifted within an amplitude VSS to VDD, the charge/discharge currents can be reduced. Thus, a total current can be suppressed even if an increment of the consumption current is generated by the potential generating circuit added newly.

In case a large number of reference cell transistors are arranged like an array, an effect of reducing the charge/discharge currents becomes more conspicuous because the load capacity of the reference word line is increased. For example, in case 2000 reference cell transistors are arranged like an array in the nonvolatile semiconductor memory the layout of which is designed by a 0.3 μm rule, the reference word line has a capacitance of 3 pF.

In case the data is read when VDD is 3 v, the charge/discharge currents of 90 μA is consumed when the reference word line is shifted within the amplitude VSS to VDD. In the case of the present embodiment, when the reference word line is shifted within VSS to 1 V at the reference word line potential of 1 v, the charge/discharge currents are reduced to 30 μA. Therefore, an effect of suppressing the consumption current of 60 μA in total is brought about.

Normally, it is not difficult to design the circuit such that the consumption current in the reference word line potential generating circuit is reduced to 60 μA or less at the time of 10 MHz. Therefore, in such example, the consumption current can be reduced much more rather than the prior art, and also an effect of suppressing the consumption current is increased rather than Patent Literature 1.

(Embodiment 2)

Figure 5:
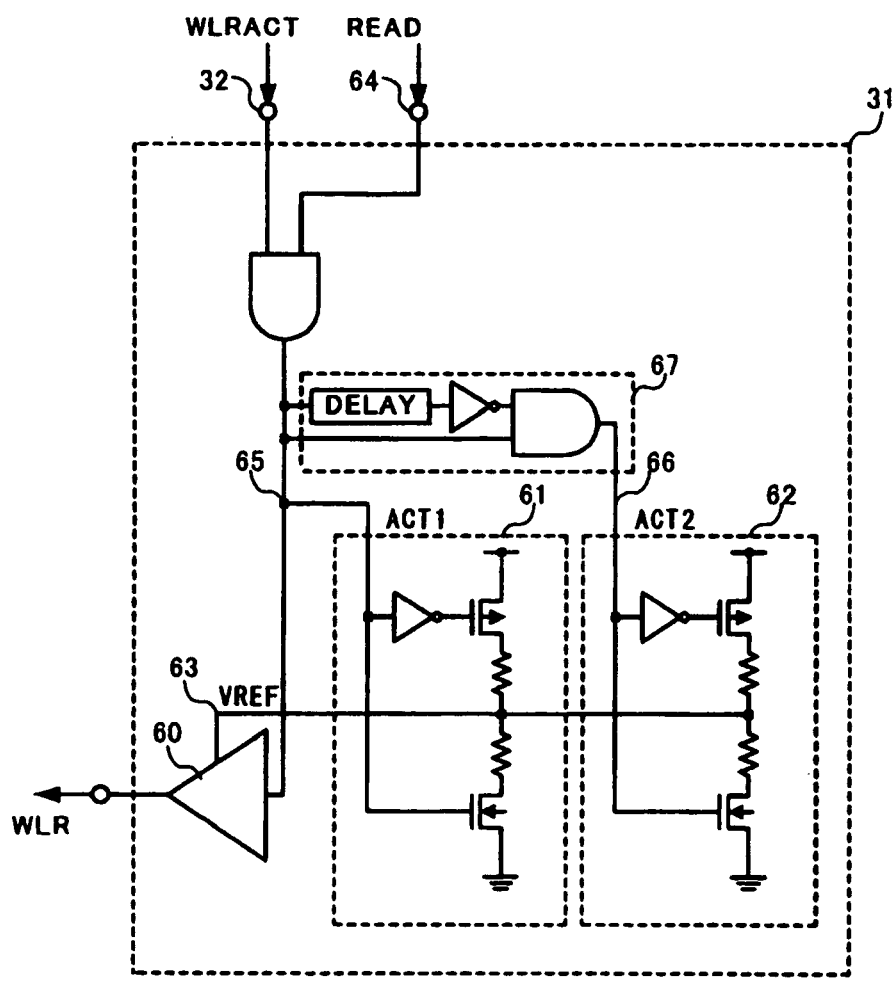
FIG. 5 is a circuit diagram showing a configuration of a reference word line potential generating circuit of a nonvolatile semiconductor device according to an embodiment 2 of the present invention.
Figure 6:
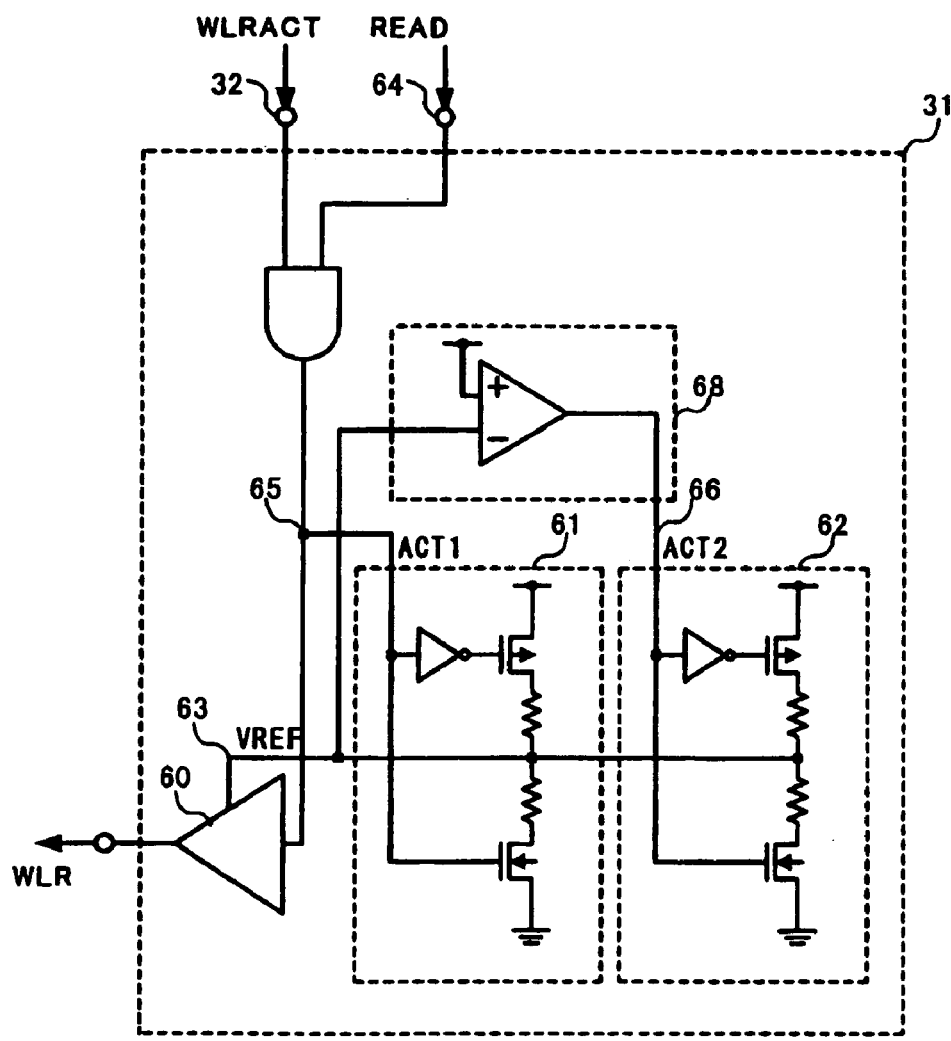
FIG. 6 is a circuit diagram showing an alternative configuration of the reference word line potential generating circuit of the nonvolatile semiconductor device according to the embodiment 2 of the present invention.
Figure 7:
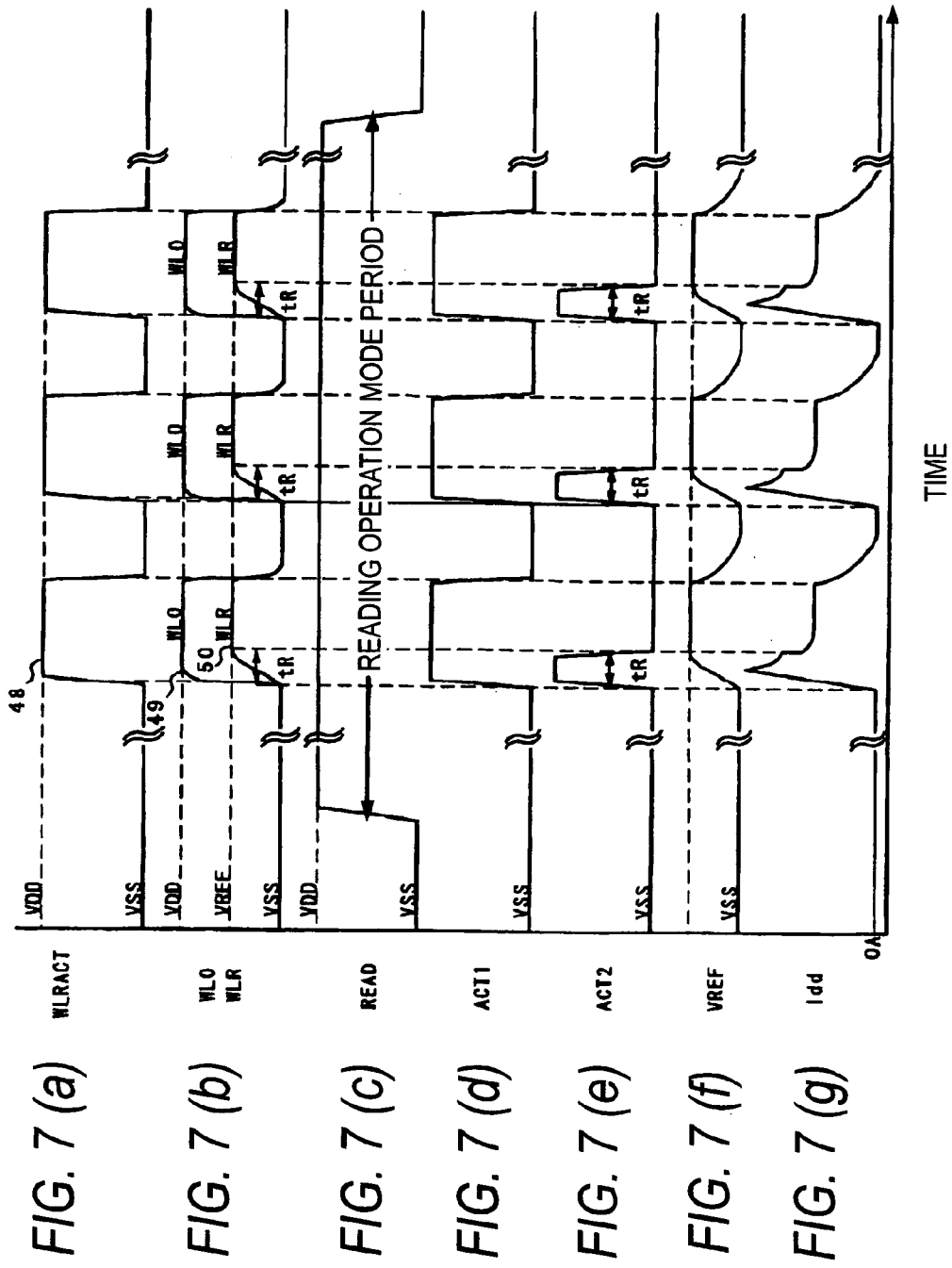
FIG. 7 is a waveform diagram explaining an operation of the nonvolatile semiconductor device according to the embodiment 2 of the present invention.

FIG. 5 and FIG. 6 are a circuit diagram showing a configuration of the reference word line potential generating circuit of the nonvolatile semiconductor memory according to an embodiment 2 of the present invention respectively. Also, FIG. 7 is a waveform diagram explaining an operation of the present embodiment. An overall configuration of the nonvolatile semiconductor memory is similar to that in FIG. 1 explained in the embodiment 1.

In FIG. 5, 60 is a reference word line driver, 61, 62 potential generating means, 63 an output node from the potential generating means 61, 62, 64 a signal READ activated in a reading operation mode period, 65 a signal ACT1 for activating the word line potential generating means 61, 66 a signal ACT2 for activating the word line potential generating means 62, and 67 a delayed pulse generating means.

In the nonvolatile semiconductor memory constructed as above, the signal READ is activated in the reading mode. Then, when WLRACT of the reference cell selecting signal 32 is activated, the signal ACT1 and the signal ACT2 are shifted to an "H" level respectively and thus both the potential generating means 61, 62 are activated. Then, the predetermined potential VREF generated in the output node 63 is applied to the reference word line 10 via the reference word line driver 60.

Then, the signal ACT2 kept at the "H" level goes to the "L" level after a predetermined time decided by the delayed pulse generating means 67 has lapsed, i.e., after a time tR shown in FIG. 7. Thus, the potential generating means 62 is unactivated.

Then, like the prior art, a difference of the current flow between the memory cell current and the reference cell current appears as a potential difference between the sense amplifier input node 25 on the bit-line side and the sense amplifier input node 26 on the reference bit-line side, and then differentially amplified by the sense amplifier 27 and output as the data.

Here, a delay time tR of the delayed pulse generating means 67 is set previously to give only a predetermined period in which a current supply to the reference word line is mostly required immediately after the signal WLACT is activated.

In this manner, the potential VREF generated by the reference word line potential generating circuit 31 can be generated by switching sequentially a current supply capability to fit to the period in which the current supply capability is mostly required to charge the reference word line.

Therefore, the current is not consumed in a preparatory period of the reading operation when the signal READ is activated but the signal WLRACT is unactivated. In contrast, the current is consumed while switching stepwise a waveform as indicated by a consumption current Idd in (g) of FIG. 7 when the signal READ is activated and the signal WLRACT is also activated.

In FIG. 5, the potential generating means is switched by the delayed pulse generating means 67. As shown in FIG. 6, the current supply capability of the potential generating means may be switched sequentially by using a circuit that feeds back the reference word line potential from the output node 63.

In FIG. 6, 68 is a feedback circuit of the reference word line potential. The delayed pulse generating means 67 in FIG. 5 is replaced with the feedback circuit 68. The feedback circuit 68 unactivates the potential generating means 62 when the output node 63 reaches the predetermined potential VREF. If a time period within which the potential generating means 62 is unactivated by the feedback circuit 68 after the output node 63 reaches the predetermined potential VREF is set to tR, the reference word line potential generating circuit executes the same operation as the waveform diagram shown in FIG. 7.

In this manner, according to the present embodiment, the consumption current Idd shown in (g) of FIG. 7 is not consumed at all until the reference word line is selected, and the large supply current can be assured in an initial stage at which the reference word line is selected. Therefore, a rise time of the reference word line having an effect on the reading speed can be shortened.

In other words, a total current supply can be controlled by switching sequentially the current supply capability of the potential generating means, and the consumption current is not generated in the preparatory period of the reading operation while preventing the degradation of the rise time of the reference word line 10. Accordingly, the consumption current can be suppressed to the lowest minimum.

(Embodiment 3)

Figure 8:
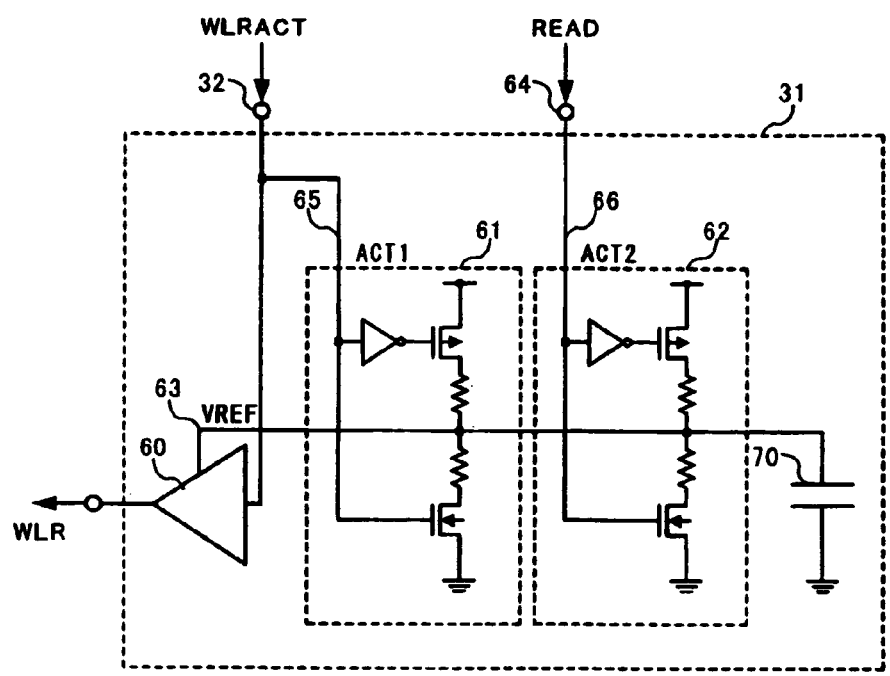
FIG. 8 is a circuit diagram showing a configuration of a reference word line potential generating circuit of a nonvolatile semiconductor device according to an embodiment 3 of the present invention.
Figure 9:
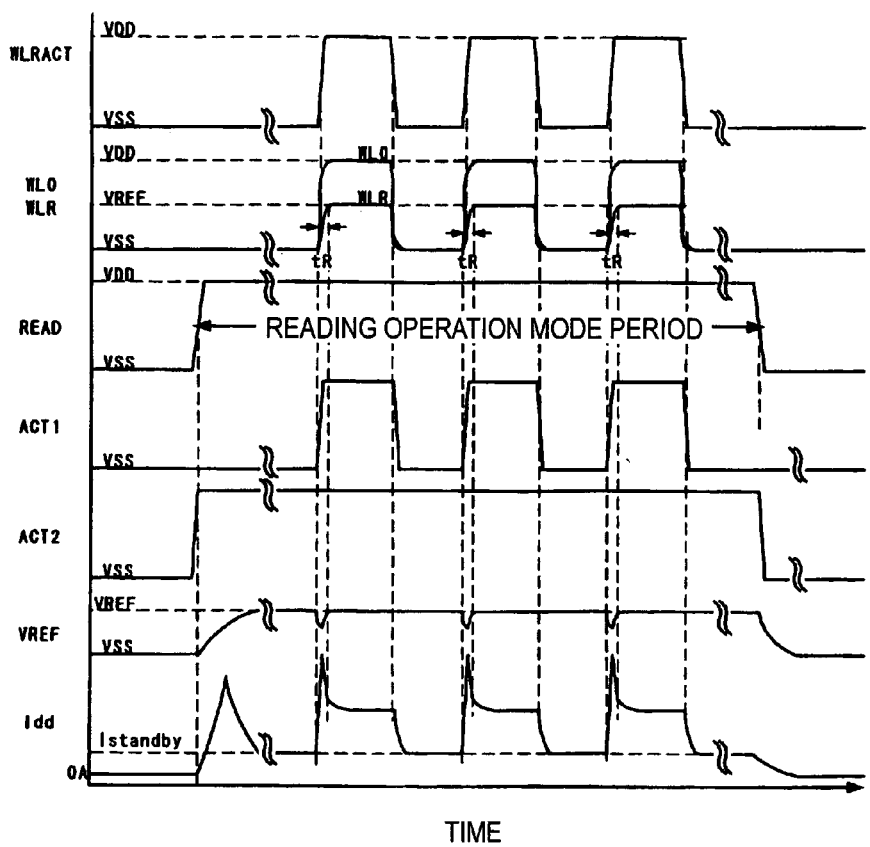
FIG. 9 is a waveform diagram explaining an operation of the nonvolatile semiconductor device according to the embodiment 3 of the present invention.

FIG. 8 is a circuit diagram showing a configuration of the reference word line potential generating circuit of a nonvolatile semiconductor memory according to an embodiment 3 of the present invention. FIG. 9 is a waveform diagram explaining an operation of the present embodiment. An overall configuration of the nonvolatile semiconductor memory is similar to that in FIG. 1 explained in the embodiment 1.

In FIG. 8, 60 to 66 are constituent elements of the reference word line potential generating circuit similar to those shown in FIG. 5, and 70 is a smoothing capacitor that makes the potential of the output node 63 smooth when the signal WLRACT is activated to supply the current.

Here, the current supply capability and the consumption current of the potential generating means 62 are set smaller than those of the potential generating means 61. The potential generating means 61 is activated only by WLRACT of the reference cell selecting signal 32, while the potential generating means 62 is activated only by the signal READ.

In the nonvolatile semiconductor memory constructed as above, first the signal ACT2 is shifted to the "H" level by the signal READ in the reading operation and thus the potential generating means 62 is always activated during the reading operation. Therefore, the node 63 of the smoothing capacitor 70 is charged slowly up to the level of VREF when the memory enters into the reading operation mode.

The layout of the smoothing capacitor 70 is designed in such a way that its capacitance value makes a charge time short in contrast to a wait time allowed after the memory enters into the reading operation mode but its capacitance value is sufficiently large against the load capacity of the reference word line to keep the supply current at the time of discharge.

Then, after the signal WLRACT is activated, the potential generating means 61 is activated when the signal ACT1 is shifted to the "H" level. Thus, the predetermined VREF is applied to the reference word line 10 via the reference word line driver 60. At this time, the potential WLR of the reference word line 10 rises quickly up to VREF by the discharge current of the smoothing capacitor 70 in addition to the supply current from the potential generating means 61.

Then, like the prior art, the difference of the current flow between the memory cell current and the reference cell current appears as the potential difference between the sense amplifier input node 25 on the bit-line side and the sense amplifier input node 26 on the reference bit-line side, and then differentially amplified by the sense amplifier 27 and output as the data.

As a result, the current value $I_{standby}$ in the potential generating means 62 is always consumed as the consumption current Idd in the reading operation mode, as shown in (g) of FIG. 9, while the large supply current can be maintained instantaneously when the reference word line is selected. Thus, a rise time of the reference word line having an effect on the reading speed can be shortened. In this manner, a total current supply can be controlled by switching sequentially the current supply capability of the potential generating means, and thus the reading operation can be further accelerated.

(Embodiment 4)

Figure 10:
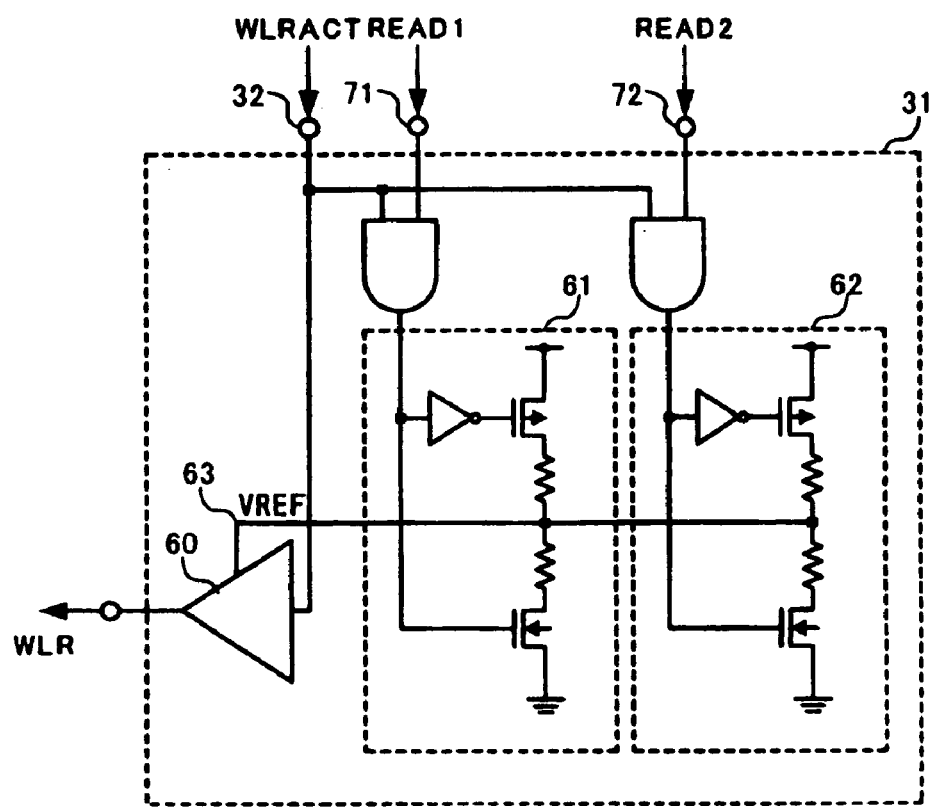
FIG. 10 is a circuit diagram showing a configuration of a reference word line potential generating circuit of a nonvolatile semiconductor device according to an embodiment 4 and an embodiment 5 of the present invention.

FIG. 10 is a circuit diagram showing a configuration of a reference word line potential generating circuit of a non-volatile semiconductor device according to an embodiment 4 of the present invention. An overall configuration of the nonvolatile semiconductor memory is similar to that in FIG. 1 explained in the embodiment 1.

In FIG. 10, 60 to 63 are constituent elements of the reference word line potential generating circuit similar to those shown in FIG. 5, and 71, 72 are signals READ1 and READ2 that are activated in the reading modes having a different operating frequency respectively.

Here, the potential generating means 61 is activated when both the signal WLRACT and the signal READ1 are activated, and the potential generating means 62 is activated when both the signal WLRACT and the signal READ2 are activated. Also, like the embodiment 1, the potential generating means 61 and the potential generating means 62 are constructed to generate the same predetermined voltage.

In the nonvolatile semiconductor memory constructed as above, the signal READ1 or the signal READ2 is activated or both the signal READ1 and the signal READ2 are activated every reading mode having the different operating frequency. When WLRACT of the reference cell selecting signal 32 is activated, only the potential generating means 61 or the potential generating means 62 is activated, or both the potential generating means 61 and the potential generating means 62 are activated, and then the predetermined potential VREF is applied to the reference word line 10 via the reference word line driver 60.

Then, like the prior art, the difference of the current flow between the memory cell current and the reference cell current appears as the potential difference between the sense amplifier input node 25 on the bit-line side and the sense amplifier input node 26 on the reference bit-line side, and then differentially amplified by the sense amplifier 27 and output as the data.

For example, in case the potential generating means 61 has the large current supply capability as well as the large consumption current rather than the potential generating means 62, both the signal READ1 and the signal READ2 are activated in the reading operation mode which has the highest operating frequency, only the signal READ1 is activated in the reading operation mode which has the next higher operating frequency, and only the signal READ2 is activated in the reading operation mode which has the third higher operating frequency. Thus, a rise time of the reference word line and the consumption current can be controlled.

Accordingly, the total current supply capability is controlled by switching the potential generating means, and the reference word line is driven by the large current supply capability when the operating frequency is high whereas the reference word line is driven by the small current supply capability when the operating frequency is low. As a result, the consumption current in the potential generating means can be controlled every operating frequency, and thus the consumption current can be suppressed to the optimum value every reading mode the frequency of which is different.

(Embodiment 5)

In the embodiment 4, the potential generating means 61 and the potential generating means 62 are constructed to generate the same predetermined voltage. The embodiment 5 is set by making the correction on the embodiment 4 such that the potential generating means 61 and the potential generating means 62 generate the different voltage respectively. That is, suppose that, in FIG. 10, the potential generating means 61 generates a potential VREF1, and the potential generating means 62 generates a potential VREF2.

Figure 11:
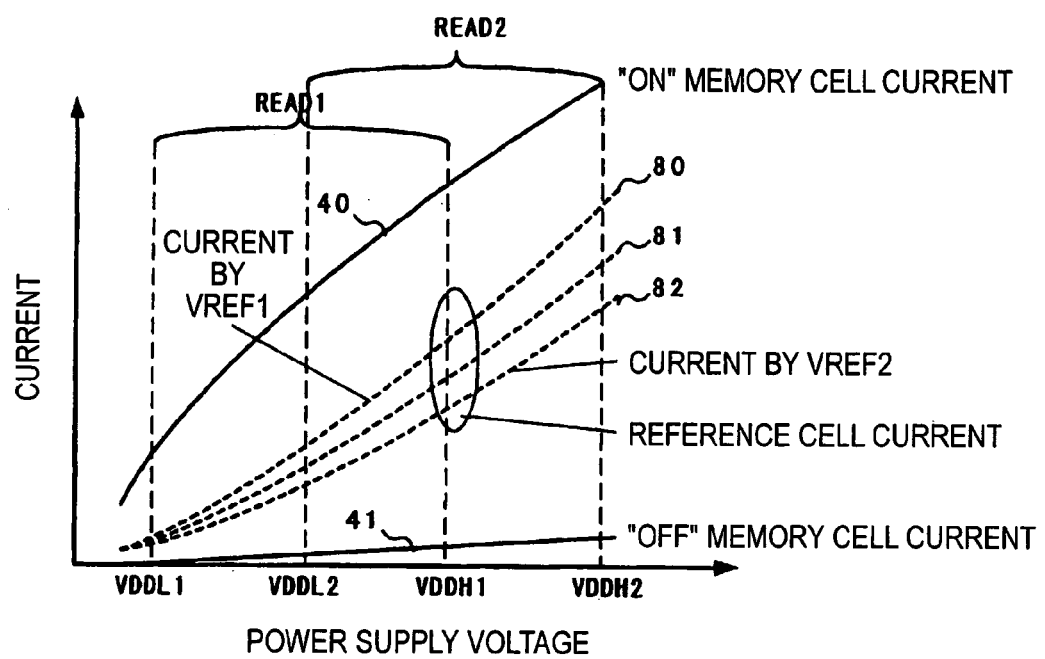
FIG. 11 is a power supply voltage characteristic view of a memory cell current and a reference cell current in the nonvolatile semiconductor device according to the embodiment 5 of the present invention.

FIG. 11 is a power supply voltage characteristic view of the memory cell current and the reference cell current in the nonvolatile semiconductor device according to the present embodiment. In FIG. 11, 80, 82 are reference cell currents for the signal READ1 and the signal READ2 in the reading modes having the different operating power supply voltage range respectively.

In the nonvolatile semiconductor memory constructed as above, the predetermined potential activated by the signal READ1 or the signal READ2 every reading mode having the different operating power supply voltage is applied to the reference word line 10 via the reference word line driver 60 respectively.

Then, like the prior art, the difference of the current flow between the memory cell current and the reference cell current appears as the potential difference between the sense amplifier input node 25 on the bit-line side and the sense amplifier input node 26 on the reference bit-line side, and then differentially amplified by the sense amplifier 27 and output as the data.

For example, in FIG. 11, in contrast to a reference cell current 81 that is optimized in the wide power supply voltage range VDDL1 to VDDH2, the potential VREF1 is applied to the reference word line in the reading mode in the low power supply voltage range VDDL1 to VDDH1, and the reference cell current 80 at that time comes close to the intermediate current characteristic between the "ON" memory cell current 40 and the "OFF" memory cell current 41. Since a difference between the memory cell current and the reference cell current becomes equal on the "ON" side and the "OFF" side respectively, the reference cell current 80 has the more desirable characteristic than the reference cell current 81.

Conversely, the potential VREF2 is applied to the reference word line in the reading mode in the high power supply voltage range VDDL2 to VDDH2. Like the above, since a difference between the memory cell current and the reference cell current becomes equal on the "ON" side and the "OFF" side respectively, the reference cell current 82 at that time has the more desirable characteristic than the reference cell current 81.

Accordingly, the predetermined potential applied to the reference word line can be controlled by switching a plurality of potential generating means each generates the different potential, and also the power supply voltage characteristic can be optimized by varying the reference cell current characteristic every operating mode. As a result, the reading operation can be carried out in the wider power supply voltage range.

(Embodiment 6)

Figure 12:
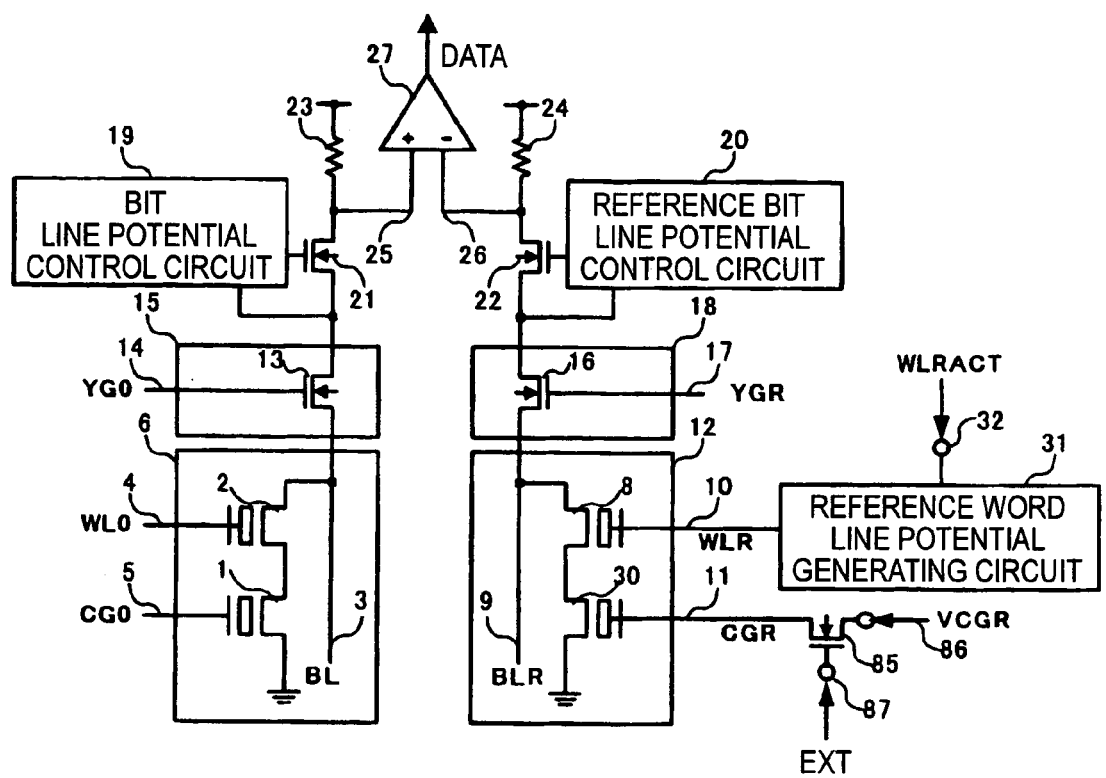
FIG. 12 is a block diagram showing an overall configuration of a nonvolatile semiconductor device according to an embodiment 6 and an embodiment 7 of the present invention.

FIG. 12 is a block diagram showing an overall configuration of a nonvolatile semiconductor memory according to an embodiment 6 of the present invention. In FIG. 12, except the constituent elements connected to the reference cell transistor control gate line 11, all constituent elements and connection relationships are similar to those in the configuration in the embodiment 1 shown in FIG. 1.

Further, in FIG. 12, 85 is a voltage applying transistor, 86 is a voltage applying terminal VCGR, and 87 is a terminal activated in a first test reading operation mode used to check a write level and an erase level at the time of test or in the rewriting process after the delivery.

Here, the voltage applying transistor 85 is constructed to connect electrically the reference cell transistor control gate line 11, which is connected to the floating gate of the reference cell transistor 30, and the voltage applying terminal VCGR.

Figure 13:
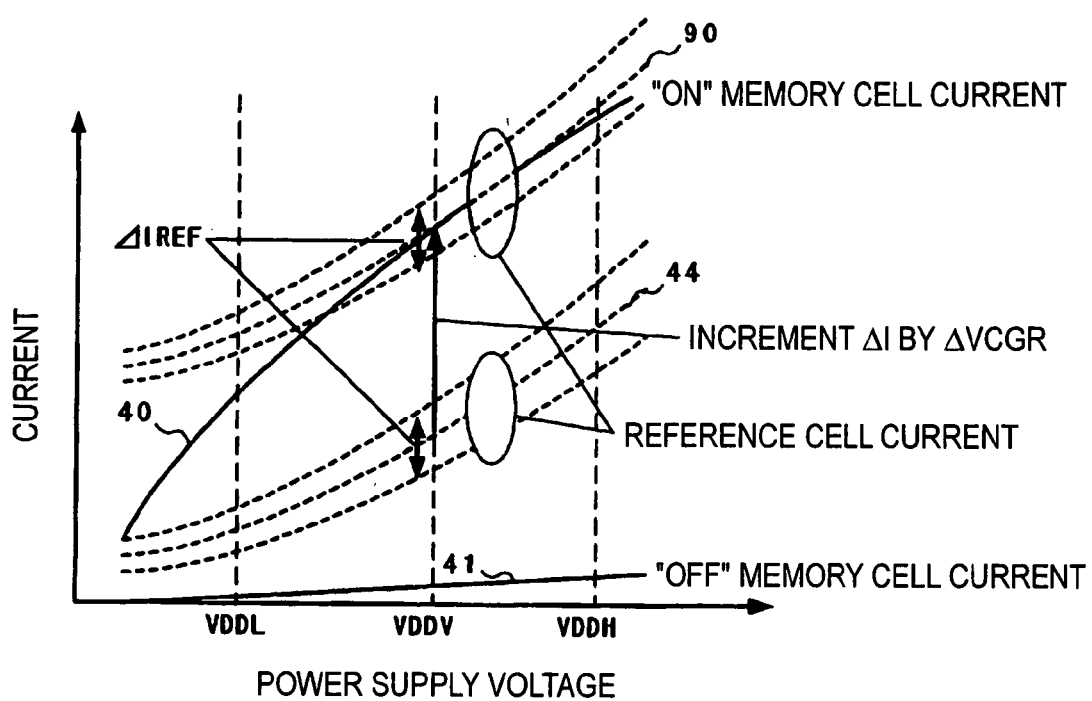
FIG. 13 is a power supply voltage characteristic view of a memory cell current and a reference cell current in the nonvolatile semiconductor device according to the embodiment 6 of the present invention.

FIG. 13 is a power supply voltage characteristic view of the memory cell current and the reference cell current in the nonvolatile semiconductor memory in the present embodiment. An operation of the nonvolatile semiconductor memory in the present embodiment will be explained with reference to FIG. 12 and FIG. 13 hereunder.

First, when the terminal EXT is activated in the first test reading operation mode, the voltage applying transistor 85 applies the predetermined voltage to the floating gate of the reference cell transistor 30 from the voltage applying terminal VCGR.

Then, like the prior art, the difference of the current flow between the memory cell current and the reference cell current appears as the potential difference between the sense amplifier input node 25 on the bit-line side and the sense amplifier input node 26 on the reference bit-line side, and then differentially amplified by the sense amplifier 27 and output as the data.

For example, in FIG. 13, in order to check the "ON" memory cell current 40 at the time of rewriting, the reference cell current is increased from the current characteristic 44 to the current characteristic 90 side by a current value $\Delta I$ by increasing the voltage applied from the voltage applying terminal VCGR by $\Delta VCGR$ in such a fashion that, when the applied voltage to the voltage applying terminal VCGR has the predetermined value, both the "ON" memory cell current 40 and the reference cell current 90 take the same value mutually.

In this manner, like the embodiment 1, the memory cell current of the memory cell 1 selected based on the address input from the outside and the reference cell current of the reference cell 20 are compared/decided in magnitude by the sense amplifier 27. Then, if it is decided that the "ON" memory cell current 40 required for the product warranty exceeds the current value of the reference cell current 90 corresponding to this current, the success of the rewriting is confirmed. In this example, the rewriting succeeds when the "ON" memory cell current 40 is in excess of the current value of the reference cell current 90, while the number of rewriting times or the rewriting time is insufficient when the "ON" memory cell current 40 is below the current value of the reference cell current 90.

In this event, in deciding the "OFF" memory cell current after the rewriting, a threshold value can be checked by comparing/deciding respective magnitudes of the "OFF" memory cell current and the reference cell current by virtue of the sense amplifier 27, while reducing the reference cell current by lowering the voltage applied from the voltage applying terminal VCGR, like the "ON" side.

Also, the threshold value of the memory cell current is decided by considering a $\Delta IREF$ caused by a variation in the reference word line potential VREF in FIG. 13. Therefore, this signifies that the threshold value of the memory cell transistor can be decided while taking account of the current characteristic of the same reference cell selecting transistor as that in the reading operation.

For example, in the case where the reference cell current has a value that is smaller by a $\Delta IREF$ in the first test reading operation mode, when the "ON" memory cell current after the rewriting process is decided smaller by a $\Delta IREF$, no trouble is caused in the reading operation applied in the product warranty since the reference cell current also has a value that is small similarly by the $\Delta IREF$ in the reading operation. Conversely, such rewriting is convenient since the over write or the over erase is not generated.

Therefore, at the time of test or after the rewriting process after the delivery, check of a write level or an erase level can be applied in the same way as the reading operation to be guaranteed actually, after a variation of the reference cell current caused due to process parameters, etc. is considered. As a result, the rewriting process can be executed with higher reliability, and an improvement in the quality can be achieved.

(Embodiment 7)

Figure 14:
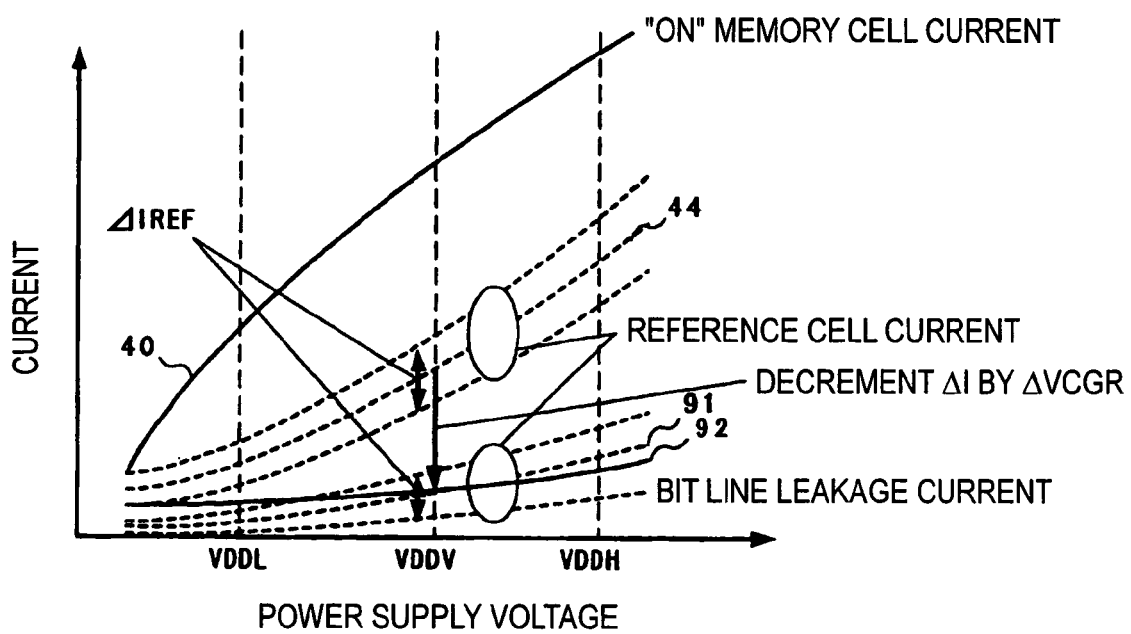
FIG. 14 is a power supply voltage characteristic view showing a relationship between a bit line leakage current and a reference cell current in the nonvolatile semiconductor device according to the embodiment 7 of the present invention.

The present embodiment executes a check of a bit line leakage current in the test step by using the configuration in the embodiment 6. FIG. 14 is a power supply voltage characteristic view showing a relationship between a bit line leakage current and a reference cell current in the nonvolatile semiconductor memory according to the present embodiment.

Like the embodiment 6, when a terminal EXT is activated in a second test reading operation mode used to check the bit line leakage current in the test step, the voltage applying transistor 85 applies the predetermined voltage to the floating gate of the reference cell 30 from the voltage applying terminal VCGR.

Then, like the prior art, the difference of the current flow between the memory cell current and the reference cell current appears as the potential difference between the sense amplifier input node 25 on the bit-line side and the sense amplifier input node 26 on the reference bit-line side, and then differentially amplified by the sense amplifier 27 and output as the data.

In FIG. 14, in order to check the bit line leakage current, the reference cell current is decreased from the current characteristic 44 to the current characteristic 91 side by the current value ΔI by decreasing the voltage applied from the voltage applying terminal VCGR by ΔVCGR in such a fashion that, when the applied voltage to the voltage applying terminal VCGR has the predetermined value, both the bit line leakage current 92 and the reference cell current 91 take the same value mutually.

At this time, unlike the embodiment 1 or the embodiment 6, all word lines of the memory cell array 6 are still kept in the non-selected state irrespective of the address input from the outside, and the bit line current and the reference cell current of the reference cell 30 are compared/decided by the sense amplifier 27. Then, if it is decided that the bit line leakage current 92 required for the reading operation in the product warranty is below the current value of the reference cell current 91 corresponding to this current, the nonvolatile semiconductor memory is confirmed as the non-defective device. In this example, the memory is accepted as the non-defective device when the current value of the bit line leakage current 92 is below the reference cell current, while the memory is accepted as the defective device when the current value of the bit line leakage current 92 exceeds the reference cell current.

In this test, all memory cells connected to the memory cell array 6 are rewritten/controlled to have the value that is in excess of the current value guaranteed as the "ON" memory cell current 40, and an amount of leakage of the non-selected memory cell is set previously to have the maximum value.

Accordingly, the test can be applied in the same way as the reading operation to be guaranteed actually, after a variation of the reference cell current caused due to process parameters, etc. is considered. As a result, the test of the bit line leakage current value can be conducted with higher reliability, and an improvement of the quality can be attained.

(Embodiment 8)

Figure 15:
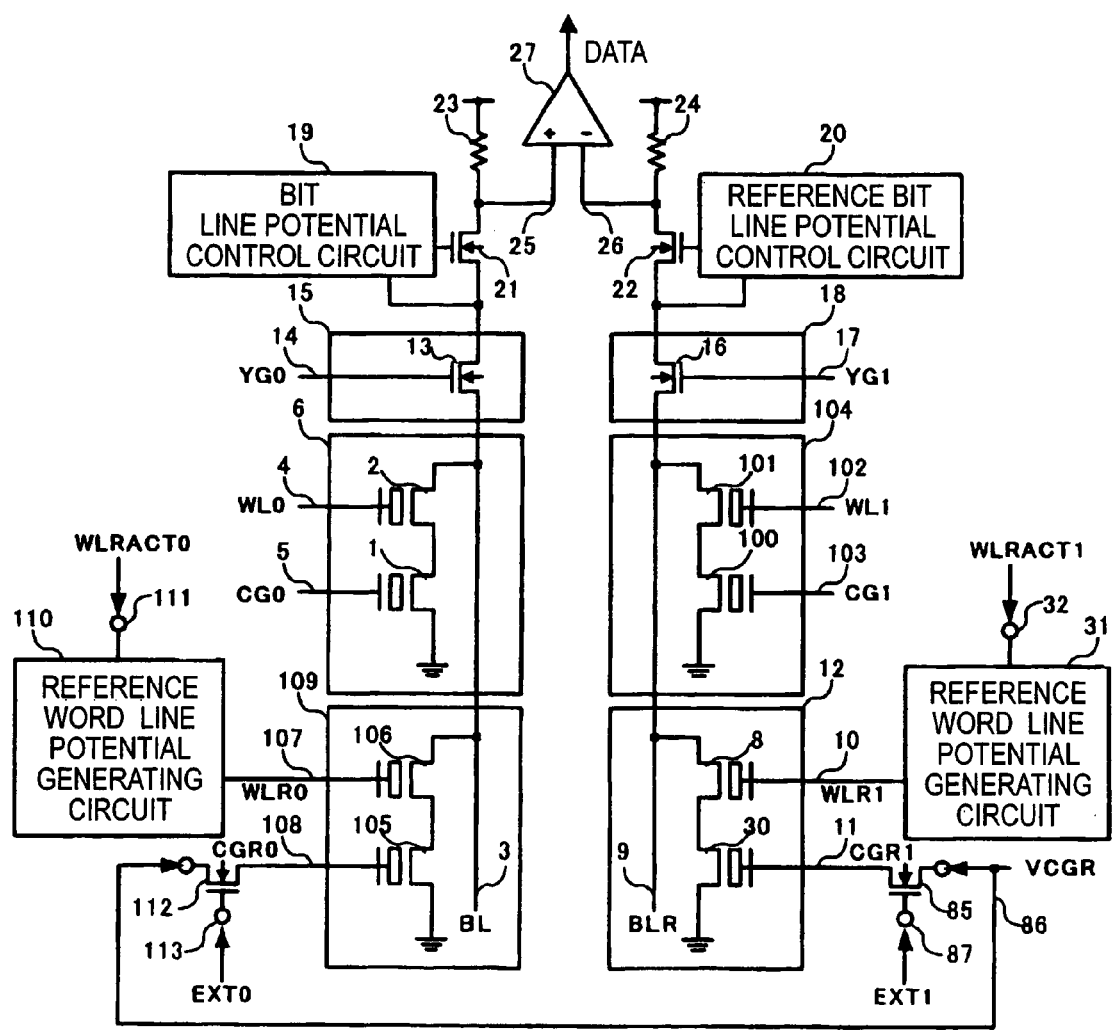
FIG. 15 is a block diagram showing an overall configuration of a nonvolatile semiconductor device according to an embodiment 8 of the present invention.

FIG. 15 is a block diagram showing an overall configuration of a nonvolatile semiconductor device according to an embodiment 8 of the present invention. In FIG. 15, 100 is a memory cell transistor, 101 a memory cell selecting transistor, 102 a word line, 103 a memory cell transistor control gate line, 104 a memory cell array, 105 a reference cell transistor, 106 a reference cell selecting transistor, 107 a reference word line, 108 a reference cell transistor control gate line, 109 a reference cell array, 110 a reference word line potential generating circuit, 111 a reference cell selecting signal, 112 a voltage applying transistor, and 113 a terminal EXT0 activated in a third test reading operation mode to check an offset of the sense amplifier at the time of test.

Other constituent elements are similar to those in the embodiment 6, and a plurality of reference memory cells are provided. The memory array 6 and the reference cell array 109 are connected to the bit line 3, and the memory cell array 104 and the reference memory cell 12 are connected to the reference bit line 9. The constituent elements on the bit line 3 side and the constituent elements on the reference bit line 9 side are arranged completely symmetrically.

Here, like the embodiment 6, the voltage applying transistor 85 connects electrically the reference cell transistor control gate line 11 connected to the floating gate of the reference cell transistor 30 and the voltage applying terminal VCGR. Also, the voltage applying transistor 112 connects electrically the reference cell transistor control gate line 108 connected to the floating gate of the reference cell transistor 105 and the voltage applying terminal VCGR. Also, only either one of the terminal EXT0 and the terminal EXT1 is activated in accordance with the address input from the outside.

Figure 16:
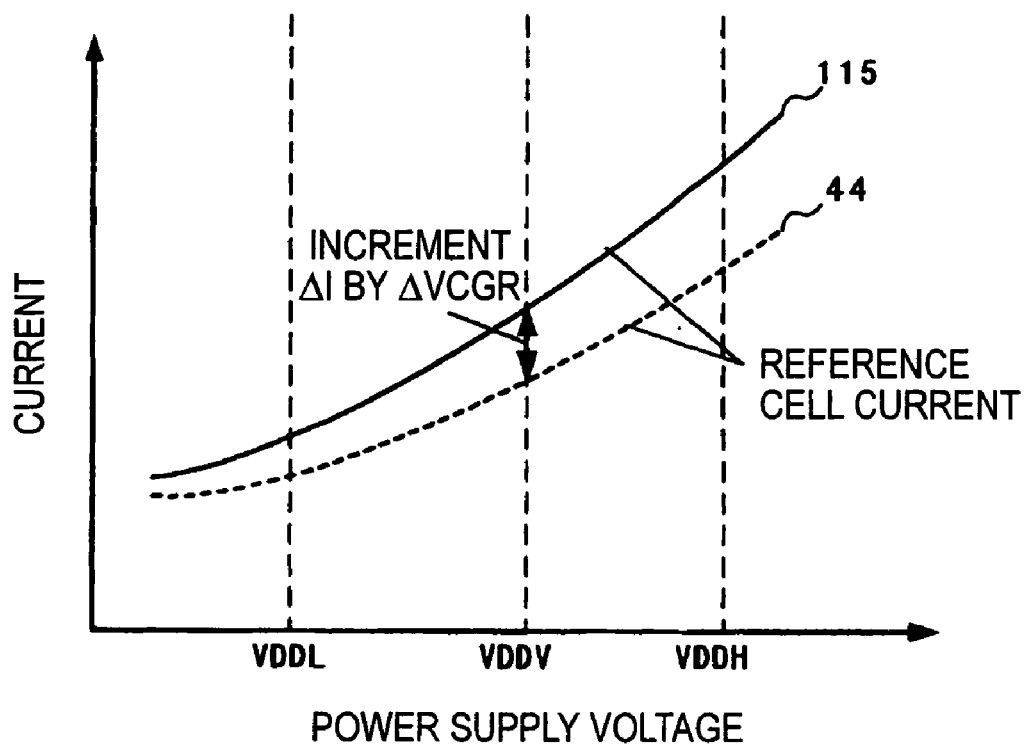
FIG. 16 is a power supply voltage characteristic view showing a relationship between two reference cell currents in the nonvolatile semiconductor device according to the embodiment 8 of the present invention.

FIG. 16 is a power supply voltage characteristic view showing a relationship between two reference cell currents in the nonvolatile semiconductor memory of the present embodiment. An operation of the nonvolatile semiconductor memory of the present embodiment will be explained with reference to FIG. 15 and FIG. 16 hereunder.

First, when the terminal EXT0 is activated in the third test reading operation mode, the voltage applying transistor 112 applies a predetermined voltage to the floating gate of the reference cell transistor 105 from the voltage applying terminal VCGR, while the power supply voltage VDDV is applied to the floating gate of the reference cell transistor 30.

Similarly, when the terminal EXT1 is activated, the voltage applying transistor 85 applies a predetermined voltage to the floating gate of the reference cell transistor 30 from the voltage applying terminal VCGR, while the power supply voltage VDDV is applied to the floating gate of the reference cell transistor 105.

Also, like the embodiment 7, all word lines of the memory cell arrays 6 and 104 are kept in a non-selected state as they are when the address is input from the outside, and merely a signal WLACT0 of the signal 111 and a signal WLACT1 of the signal 32 are activated.

Then, like the prior art, the difference of the current flow between the memory cell current and the reference cell current appears as the potential difference between the sense amplifier input node 25 on the bit-line side and the sense amplifier input node 26 on the reference bit-line side, and then differentially amplified by the sense amplifier 27 and output as the data.

In this case, there are a mismatching of the transistors, a difference of parasitic capacitances, etc. caused by the process parameters in the actual products. The decision value of the sense amplifier 27 is not always switched when a potential difference between the input node 25 and the input node 26 is zero. Normally an offset voltage value of several tens mV is present.

For example, in FIG. 16, in the case where no offset voltage value is present, the reference cell current is increased from the current characteristic of 44 to the current characteristic side of 115 by the current value ΔI by increasing the voltage applied from the voltage applying terminal VCGR from VDDV by ΔVCGR. At that time, when the applied voltage to the voltage applying terminal VCGR is kept at the predetermined value, the reference cell current 44 and the reference cell current 115 have the same value and the decision value is switched. The current value ΔI in this case corresponds to the difference current ΔIREF caused due to the variation of two reference cell current values themselves.

In contrast, in the case where the offset voltage value is present, if the decision value of the sense amplifier 27 is switched although the difference voltage ΔVCGR is present, the current value ΔI caused by the difference voltage ΔVCGR in this case signifies a total value of the difference current Δ IREF caused due to the variation of two reference cell current values themselves and a current value for compensating the offset voltage of the sense amplifier 27. A magnitude of the value ΔVCGR or the value ΔI acts as one factor that decides the reading characteristics such as the reading operating frequency, and the like, and a smaller value is desirable.

In this case, if all memory cells connected to the memory cell array 6 or 104 are rewritten/controlled to have the value that is more than the current value of the "ON" memory cell current 40 and also an amount of leakage from the non-selected word line is set previously to become maximum, the offset of the sense amplifier can be checked after the bit line leakage current from the memory cell is considered, like the embodiment 7.

Accordingly, the test can be applied in the same way as the reading operation to be guaranteed actually, after a variation of the reference cell current caused due to process parameters, etc. is considered. As a result, the offset of the sense amplifier can be checked with higher reliability, and also an improvement of the quality can be achieved.

According to the nonvolatile semiconductor memory of the present invention, the power supply voltage characteristic of the reference cell current can be controlled to come close to the power supply voltage characteristic of the memory cell current. Therefore, such effects can be achieved that the power supply voltage dependency of the reading speed can be relaxed or the unstable factors caused due to variation in the temperature characteristic of the memory cell or production parameters, etc. can be suppressed and in addition a production cost increasing factor, a deteriorating factor after the delivery, and the like can be reduced. The present invention is valuable for the circuit technology of the nonvolatile semiconductor memory that can read stably the data at a high speed by using the differential sense amplifier that compares/decides the memory cell current and the reference cell current, etc.

What is claimed is:

1. A nonvolatile semiconductor memory, comprising:
   a memory cell, composed of a memory cell transistor having a floating gate and a control gate and a memory cell selecting transistor;
   a word line, connected to a gate of the memory cell selecting transistor;
   a bit line, connected to a drain of the memory cell;
   a reference cell, composed of a reference cell transistor, which has a same structure as the memory cell transistor and to a floating gate of which a predetermined potential is applied, and a reference cell selecting transistor;
   a reference word line, connected to agate of the reference cell selecting transistor;
   a reference bit line, connected to a drain of the reference cell;
   a column decoder, for selecting the bit line of the memory cell in response to an input column address;
   a differential sense amplifier, for comparing/deciding a current of the selected bit line and a current of the reference bit line in a reading operation; and
   a reference word line potential generating circuit for generating a reference word line potential applied to the reference word line;
   wherein the reference word line potential is a first potential between a potential applied to the selected word line and a potential applied to the unselected word line.

2. The nonvolatile semiconductor memory according to claim 1, wherein a gate oxide film of the memory cell transistor and a gate oxide film of the reference cell transistor have a same film thickness dimension.

3. The nonvolatile semiconductor memory according to claim 1, wherein a gate oxide film of the memory cell selecting transistor and a gate oxide film of the reference cell selecting transistor have a same film thickness dimension.

4. The nonvolatile semiconductor memory according to claim 1, wherein the memory cell transistor and the reference cell transistor are formed of an N-channel transistor and, in a reading operation, a ground potential is applied to a control gate of the memory cell transistor and a power supply potential is applied to a floating gate of the reference cell transistor.

5. The nonvolatile semiconductor memory according to claim 1, wherein the memory cell transistor and the reference cell transistor are formed of a P-channel transistor and, in a reading operation, a power supply potential is applied to a control gate of the memory cell transistor and a ground potential is applied to a floating gate of the reference cell transistor.

6. The nonvolatile semiconductor memory according to claim 1, wherein the reference word line potential generating circuit receives a reference cell selecting signal to select a gate of the reference cell selecting transistor and generates the first potential when a reading operation is executed and the reference cell selecting signal is activated, and an amplitude of a potential applied to the reference word line is controlled to range from an unselected potential to the first potential.

7. The nonvolatile semiconductor memory according to claim 1, wherein the reference word line potential generating circuit is composed of a plurality of potential generating means for generating the first potential and receives a reference cell selecting signal to select a gate of the reference cell selecting transistor, the plurality of potential generating means are activated when a reading operation is executed and the reference cell selecting signal is activated, and the plurality of potential generating means are controlled to be sequentially unactivated after an amplitude of a potential applied to the reference word line is controlled to rise from an unselected potential to the first potential.

8. The nonvolatile semiconductor memory according to claim 1, wherein the reference word line potential generating circuit is composed of a plurality of potential generating means for generating the first potential and receives a reference cell selecting signal to select a gate of the reference cell selecting transistor, only the potential generating means having a minimum current supply capability is activated when a reading operation is executed and the reference cell selecting signal is not activated, and an amplitude of a potential applied to the reference word line when the reference cell selecting signal is activated is controlled to range from an unselected potential to the first potential.

9. The nonvolatile semiconductor memory, according to claim 1, wherein the reference word line potential generating circuit is composed of a plurality of potential generating means for generating the first potential and receives a reference cell selecting signal to select a gate of the reference cell selecting transistor and a plurality of reading mode signals to discriminate a plurality of reading operation modes, the plurality of potential generating means are switched in response to the plurality of reading mode signals and activated in a reading operation, and an amplitude of a potential applied to the reference word line when the reference cell selecting signal is activated is controlled to range from an unselected potential to the first potential.

10. The nonvolatile semiconductor memory according to claim 1, wherein the reference word line potential generating circuit is composed of a plurality of potential generating means for generating a plurality of potentials and receives a reference cell selecting signal to select a gate of the reference cell selecting transistor and a plurality of reading mode signals to discriminate a plurality of reading operation modes, one potential generating means is selected and activated based on the reading mode signals from the plurality of potential generating means in a reading operation, and an amplitude of a potential applied to the reference word line when the reference cell selecting signal is activated is controlled to range from an unselected potential to a potential generated by the potential generating means that is selected by the reading mode signal.

11. The nonvolatile semiconductor memory according to claim 1, further comprising a voltage applying transistor connected to the floating gate of the reference cell transistor;
wherein a first test reading operation mode in which a potential is applied from an external terminal via the voltage applying transistor is provided.

12. The nonvolatile semiconductor memory, according to claim 11, wherein a second test reading operation mode in which all word lines are controlled into an unselected state is provided.

13. The nonvolatile semiconductor memory, according to claim 11, further comprising the reference cell, to which the voltage applying transistor is connected, in plural;
wherein at least one of reference cells is connected to the bit line, and a third test reading operation mode in which only the memory cell connected to the bit line and the reference cell connected to the reference bit line are selected and all word lines are controlled into an unselected state is provided.

14. A nonvolatile semiconductor memory comprising:
a memory cell composed of a memory cell transistor having a floating gate and a control gate and a memory cell selecting transistor;
a word line connected to a gate of the memory cell selecting transistor;
a bit line connected to a source of the memory cell;
a reference cell composed of a reference cell transistor, which has a same structure as the memory cell transistor and to a floating gate of which a predetermined potential is applied, and a reference cell selecting transistor;
a reference word line connected to a gate of the reference cell selecting transistor;
a reference bit line connected to a source of the reference cell;
a column decoder for selecting the bit line of the memory cell in response to an input column address;
a differential sense amplifier for comparing/deciding a current of the bit line selected in a reading operation and a current of the reference bit line; and
a reference word line potential generating circuit for generating a reference word line potential applied to the reference word line;
wherein the reference word line potential is a first potential between a potential applied to the selected word line and a potential applied to the unselected word line.

15. The nonvolatile semiconductor memory according to claim 14, wherein a gate oxide film of the memory cell transistor and a gate oxide film of the reference cell transistor have a same film thickness dimension.

16. The nonvolatile semiconductor memory according to claim 14, wherein a gate oxide film of the memory cell selecting transistor and a gate oxide film of the reference cell selecting transistor have a same film thickness dimension.

17. The nonvolatile semiconductor memory according to claim 14, wherein the memory cell transistor and the reference cell transistor are formed of an N-channel transistor and, in a reading operation, a ground potential is applied to a control gate of the memory cell transistor and a power supply potential is applied to a floating gate of the reference cell transistor.

18. The nonvolatile semiconductor memory according to claim 14, wherein the memory cell transistor and the reference cell transistor are formed of a P-channel transistor and, in a reading operation, a power supply potential is applied to a control gate of the memory cell transistor and a ground potential is applied to a floating gate of the reference cell transistor.

19. The nonvolatile semiconductor memory according to claim 14, wherein the reference word line potential generating circuit receives a reference cell selecting signal to select a gate of the reference cell selecting transistor and generates the first potential when a reading operation is executed and the reference cell selecting signal is activated, and an amplitude of a potential applied to the reference word line is controlled to range from an unselected potential to the first potential.

20. The nonvolatile semiconductor memory according to claim 14, wherein the reference word line potential generating circuit is composed of a plurality of potential generating means for generating the first potential and receives a reference cell selecting signal to select a gate of the reference cell selecting transistor, the plurality of potential generating means are activated when a reading operation is executed and the reference cell selecting signal is activated, and the plurality of potential generating means are controlled to be sequentially unactivated after an amplitude of a potential applied to the reference word line is controlled to rise from an unselected potential to the first potential.

21. The nonvolatile semiconductor memory according to claim 14, wherein the reference word line potential generating circuit is composed of a plurality of potential generating means for generating the first potential and receives a reference cell selecting signal to select a gate of the reference cell selecting transistor, only the potential generating means having a minimum current supply capability is activated when a reading operation is executed and the reference cell selecting signal is not activated, and an amplitude of a potential applied to the reference word line when the reference cell selecting signal is activated is controlled to range from an unselected potential to the first potential.

22. The nonvolatile semiconductor memory, according to claim 14, wherein the reference word line potential generating circuit is composed of a plurality of potential generating means for generating the first potential and receives a reference cell selecting signal to select a gate of the reference cell selecting transistor and a plurality of reading mode signals to discriminate a plurality of reading operation modes, the plurality of potential generating means are switched in response to the plurality of reading mode signals and activated in a reading operation, and an amplitude of a potential applied to the reference word line when the reference cell selecting signal is activated is controlled to range from an unselected potential to the first potential.

23. The nonvolatile semiconductor memory according to claim 14, wherein the reference word line potential generating circuit is composed of a plurality of potential generating means for generating a plurality of potentials and receives a reference cell selecting signal to select a gate of the reference cell selecting transistor and a plurality of reading mode signals to discriminate a plurality of reading operation modes, one potential generating means is selected and activated based on the reading mode signals from the plurality of potential generating means in a reading operation, and an amplitude of a potential applied to the reference word line when the reference cell selecting signal is activated is controlled to range from an unselected potential to a potential generated by the potential generating means that is selected by the reading mode signal.

24. The nonvolatile semiconductor memory according to claim 14, further comprising a voltage applying transistor connected to the floating gate of the reference cell transistor;

wherein a first test reading operation mode in which a potential is applied from an external terminal via the voltage applying transistor is provided.

25. The nonvolatile semiconductor memory, according to claim 24, wherein a second test reading operation mode in which all word lines are controlled into an unselected state is provided.

26. The nonvolatile semiconductor memory, according to claim 24, further comprising the reference cell, to which the voltage applying transistor is connected, in plural;

wherein at least one of reference cells is connected to the bit line, and a third test reading operation mode in which only the memory cell connected to the bit line and the reference cell connected to the reference bit line are selected and all word lines are controlled into an unselected state is provided.

* * * * *